US00RE44824E

(19) United States
(12) Reissued Patent
Lee et al.

(10) Patent Number: US RE44,824 E
(45) Date of Reissued Patent: Apr. 8, 2014

(54) PYRENE DERIVATIVES AND ORGANIC ELECTRONIC DEVICE USING PYRENE DERIVATIVES

(75) Inventors: Dong Hoon Lee, Seoul (KR); Kong Kyeom Kim, Daejeon (KR); Jae Soon Bae, Daejeon (KR); Dae Woong Lee, Daejeon (KR); Jung Bum Kim, Daejeon (KR)

(73) Assignee: LG Chem, Ltd., Seoul (KR)

(21) Appl. No.: 13/102,406

(22) Filed: May 6, 2011

Related U.S. Patent Documents

Reissue of:
(64) Patent No.: 7,745,819
Issued: Jun. 29, 2010
Appl. No.: 11/474,980
Filed: Jun. 27, 2006

(30) Foreign Application Priority Data

Jun. 30, 2005 (KR) ..... 10-2005-0057717

(51) Int. Cl.
*H01L 35/24* (2006.01)
*H01L 51/00* (2006.01)

(52) U.S. Cl.
USPC ..... 257/40; 257/E51.001; 257/E51.049

(58) Field of Classification Search
USPC ..... 257/40, E51.001, E51.049
See application file for complete search history.

(56) References Cited

U.S. PATENT DOCUMENTS

| | | | |
|---|---|---|---|
| 5,294,512 | A | 3/1994 | Suzuki et al. |
| 6,617,609 | B2 | 9/2003 | Kelley et al. |
| 2005/0031898 | A1 | 2/2005 | Li et al. |
| 2005/0079385 | A1 | 4/2005 | Nomura et al. |

FOREIGN PATENT DOCUMENTS

| | | |
|---|---|---|
| JP | 2000-273056 | 10/2000 |
| JP | 2002-329578 | 11/2002 |
| JP | 2005-126431 | 10/2004 |
| JP | 2005-011806 | 1/2005 |
| JP | 2005-260094 | 9/2005 |
| WO | WO 03/012890 | 2/2003 |

OTHER PUBLICATIONS

J.K. Stille and E.L. Mainen, "Thermally Stable Ladder Polyquinoxalines", Macromolecules, 1968, p. 36-42, vol. 1, No. 1, Iowa City, Iowa, U.S.A.
G. Holzmann, H. W. Rothkopt, R. Muller and D. Wohrle, "Massenspektren Heteroaromatischer Nitrile", Organic Mass Spectrometry, 1975, p. 97-115, vol. 10, Issue 2.
Frederick G. Oberender and Joseph A. Dixon, "Osmium and Ruthenium Tetroxide-Catalyzed Oxidations of Pyrene", Journal of Organic Chemistry, 1959, p. 1226-1229, vol. 24.
Steven P. Schmidt and Gary B. Schuster, "Chemiluminescence of Dimethyldioxetanone Unimolecular Generation of Excited Singlet and Triple Acetone Chemically Initiated Electron-Exchange Luminescense, the Primary Light Generating Reaction", Journal of the American Chemical Society, 1980, 102:1. p. 306-314 U.S.

(Continued)

*Primary Examiner* — Anthony Ho
(74) *Attorney, Agent, or Firm* — McKenna Long & Aldridge

(57) ABSTRACT

The present invention provides an organic electronic device using the compound of the formula (1) and a pyrene derivative having a new structure.

19 Claims, 1 Drawing Sheet

(56) References Cited

OTHER PUBLICATIONS

Sakaino Yoshiko, "Complexes of Substituted Imidazoles With Chloranil", Japanese Journal of Chemistry, 1971, 92(4), p. 365-370. (cited in office action of Taiwan application No. 095123834 dated Feb. 18, 2011; no English translation available).
Hu et al. "Synthesis and properties of planar liquid-crystalline bisphenzaines", Chem. Mater., Nov. 2004, vol. 16, No. 24, pp. 4912-4915.
Nishida et al. "Preparation, characterization, and FET properties of novel dicyanopyrazinoquinoxaline derivatives", Organic Letters, Apr. 2004, vol. 6, No. 12, pp. 2007-2010.
Sakaino, "Complexes of substituted imidazoles with chloranil," Nippon Kagaku Zasshi (1971), 92(4), 365-70.*
Machine Translation of JP 2005-126431.*
"Complexes of Substituted Imidazoles with Chloranil", Japan Chemistry Journal, 94(4), 365-370, 1971.

* cited by examiner

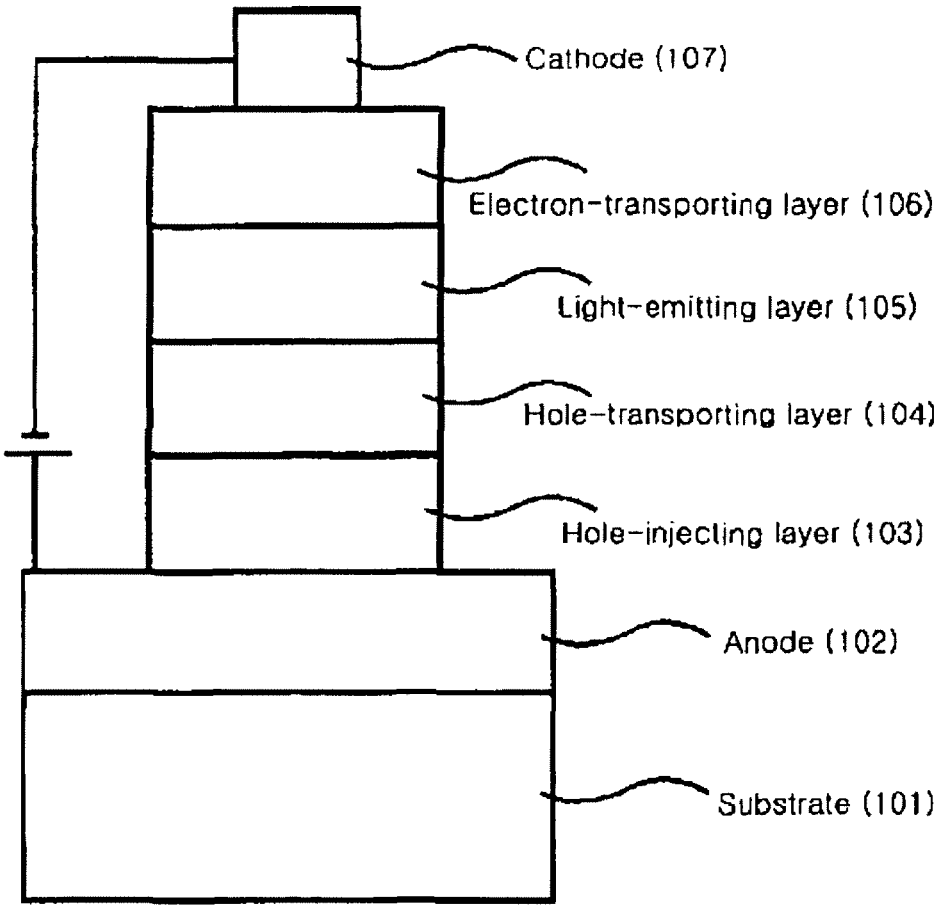
Cathode (107)
Electron-transporting layer (106)
Light-emitting layer (105)
Hole-transporting layer (104)
Hole-injecting layer (103)
Anode (102)
Substrate (101)

PYRENE DERIVATIVES AND ORGANIC ELECTRONIC DEVICE USING PYRENE DERIVATIVES

Matter enclosed in heavy brackets [ ] appears in the original patent but forms no part of this reissue specification; matter printed in italics indicates the additions made by reissue.

TECHNICAL FIELD

The present invention relates to an organic electronic device using a pyrene derivative having a specific structure. Further, the invention relates to a pyrene derivative having a new structure, which can be used for organic electronic devices.

This application claims priority benefits from Korean Patent Application No. 10-2005-0057717, filed on Jun. 30, 2005, the entire contents of which are fully incorporated herein by reference.

BACKGROUND ART

The term "organic electronic device" as used in the present specification refers to a device requiring charge exchange between an electrode using holes and/or electrons and an organic material. The organic electronic device can be largely classified into two types according to its operational principle as follows: One type is an electronic device having a configuration in which an excision is formed in an organic material layer by photons flown from an external light source into the device and the exciton is separated into an electron and a hole, the electron and the hole formed are transported to a different electrode, respectively and used as a current source (voltage source), and the other type is an electronic device having a configuration in which a hole and/or electron are/is injected into an organic material semiconductor forming an interface with an electrode by applying a voltage or current to two or two or more electrodes to allow the device to operate by means of the injected electron and hole.

Examples of the organic electronic device include an organic light-emitting device, an organic solar cell, an organic photoconductor (OPC) and an organic transistor, which all require a hole-injecting or hole-transporting material, an electron-injecting or electron-transporting material, or a light-emitting material for driving the device. Hereinafter, the organic light-emitting device will be mainly and specifically described, but in the above-mentioned organic electronic devices, the hole-injecting or hole-transporting material, the electron-injecting or electron-transporting material, or the light-emitting material injection functions according to a similar principle.

In general, the term "organic light-emitting phenomenon" refers to a phenomenon in which electric energy is converted to light energy by means of an organic material. The organic light-emitting device using the organic light-emitting phenomenon has a structure usually comprising an anode, a cathode and an organic material layer interposed therebetween. Herein, the organic material layer may be mostly formed in a multilayer structure comprising layers of different materials, for example, the hole-injecting layer, the hole-transporting layer, the light-emitting layer, the electron-transporting layer, the electron-injecting layer and the like, in order to improve efficiency and stability of the organic light-emitting device. In the organic light-emitting device having such a structure, when a voltage is applied between two electrodes, holes from the anode and electrons from a cathode are injected into the organic material layer, the holes and the electrons injected are combined together to form excitons. Further, when the excitons drop to a ground state, lights are emitted. Such an organic light-emitting device is known to have characteristics such as self-luminescence, high brightness, high efficiency, low drive voltage, wide viewing angle, high contrast and high-speed response.

The materials used for the organic material layer of the organic light-emitting device can be classified into a light-emitting material and a charge-transporting material, for example, a hole-injecting material, a hole-transporting material, an electron-transporting material and an electron-injecting material, according to their functions. Further, the light-emitting material can be divided into a blue, green or red light-emitting material and a yellow or orange light-emitting material required for giving more natural color, according to a light-emitting color. On the other hand, an efficiency of a device is lowered owing to maximum luminescence wavelength moved to a longer wavelength due to the interaction between molecules, deterioration of color purity and reduction in light emitting efficiency when only one material is used for the light-emitting material, and therefore a host/dopant system can be used as the light-emitting material for the purpose of enhancing color purity and light emitting efficiency through energy transfer.

In order to allow the organic light-emitting device to fully exhibit the above-mentioned excellent characteristics, a material constituting the organic material layer in the device, for example, a hole-injecting material, a hole-transporting material, a light-emitting material, an electron-transporting material and an electron-injecting material should be essentially composed of a stable and efficient material. However, the development of a stable and efficient organic material layer material for the organic light-emitting device has not yet been fully realized. Accordingly, the development of new materials is continuously desired. The development of such a material is equally required to the above-mentioned other organic electronic devices.

DISCLOSURE

Technical Problem

The present inventors have found that a pyrene derivative having a specific structure can perform functions of hole injection and transportation, electron injection and transportation, and/or light emission in an organic electronic device including an organic light-emitting device, according to the substituents on the pyrene derivative and have further found a pyrene derivative having a new structure, which can be used as an organic material layer material for the organic electronic device.

Technical Solution

Accordingly, it is an object of the present invention to provide an organic electronic device using a pyrene derivative having a specific structure and a pyrene derivative having a new structure.

Advantageuos Effects

The pyrene derivative having a specific structure according to the invention has a basic structure in which the derivative can perform functions of not only electron or hole injection and/or transportation, but also that of light emission, for example, that of a single light-emitting material, a light-emitting dopant together with a suitable host or a blue light-emitting host together with a suitable dopant in an organic electronic device, and has a structure more suitable for a function of each organic material layer of an organic electronic device including an organic light-emitting device by introducing various substituents. By applying the pyrene derivative having a specific structure according to the invention to the organic electronic device, it is possible to achieve excellent effects in terms of an efficiency of a device, drive voltage and stability.

DESCRIPTION OF DRAWINGS

FIG. 1 illustrates a structure of an organic light-emitting device according to one embodiment of the present invention.

BEST MODE

The present invention provides an organic electronic device comprising a first electrode, a second electrode and at least one organic material layer arranged between the first electrode and the second electrode, in which at least one organic material layer comprises a compound represented by the following formula (1):

(1)

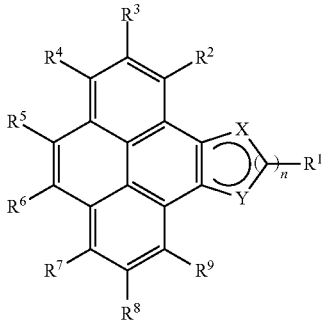

wherein n is an integer of 1 or 2;

X is CH or N;

Y is $NR^0$ when n=1 and N when n=2 wherein $R^0$ is selected from the group consisting of a hydrogen atom, a substituted or unsubstituted alkyl group and a substituted or unsubstituted aryl group;

$R^1$ to $R^9$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and these may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

In the invention, the formula (1) may be the following formula (2):

(2)

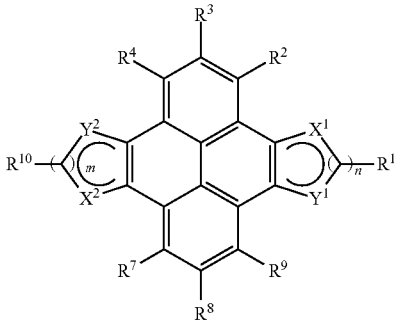

wherein m and n are each an integer of 1 or 2;

$X^1$ and $X^2$ are each independently CH or N;

$Y^1$ and $Y^2$ are each independently $NR^0$ when n=1 and N when n=2 wherein $R^0$ is selected from the group consisting of a hydrogen atom, a substituted or unsubstituted alkyl group and a substituted or unsubstituted aryl group;

$R^1$ to $R^4$ and $R^7$ to $R^{10}$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN),nitritro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and these may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

Further, the invention provides a compound selected from the compounds represented by the following formulas (3) to (8):

(3)

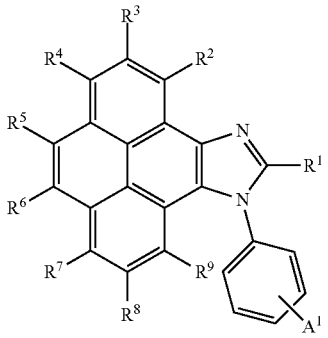

wherein $R^1$ to $R^9$ and $A^1$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), nitritro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and these may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

(4)

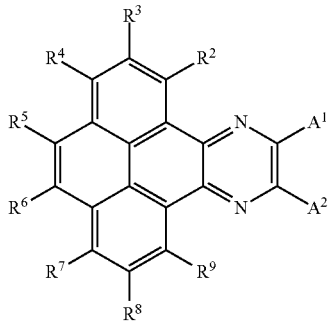

wherein $R^2$ to $R^9$, $A^1$ and $A^2$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and these may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

(5)

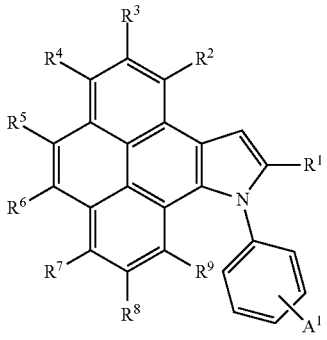

wherein $R^1$ to $R^9$ and $A^1$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and these may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

(6)

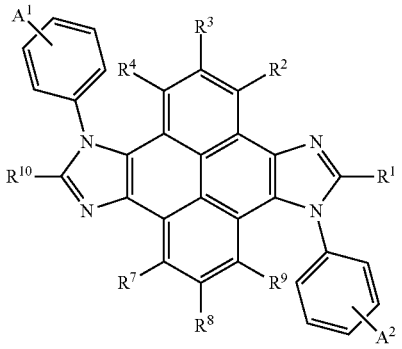

wherein $R^1$ to $R^4$, $R^7$ to $R^{10}$, $A^1$ and $A^2$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and these may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

(7)

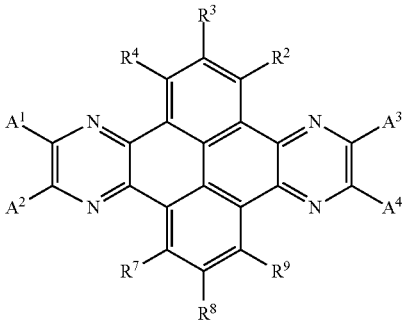

wherein $R^2$ to $R^4$, $R^7$ to $R^9$, and $A^1$ to $A^4$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and these may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

(8)

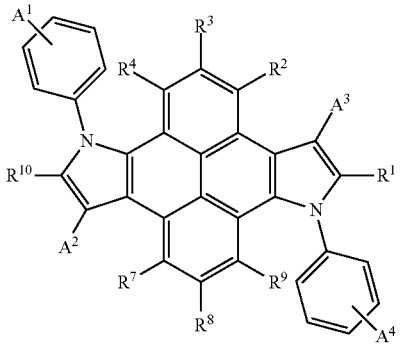

wherein $R^1$ to $R^4$, $R^7$ to $R^{10}$, and $A^1$ to $A^4$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and these may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

The invention will be described in detail below.

A steric structure of the compound of the above formula (1) according to the invention can be considered to be divided into two portions, A and B portions, as shown in the following figure:

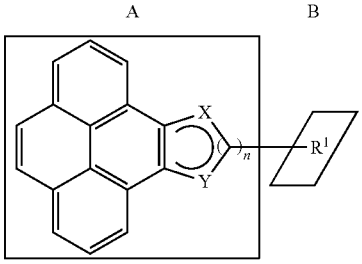

The A portion has a planar structure as a whole in that pyrene forms a fused ring, together with imidazole, pyrrole or pyrazine.

Imidazole, pyrrole and pyrazine are largely used as the substituent of an electron-injecting, electron-transporting material and the like in the organic light-emitting device and are known to have an important influence on functions of electron injection or transportation or light emission. Therefore, the A portion of a pyrene derivative forming a fused ring together with the substituent has n-type properties. The term "n-type properties" as used herein generally refers to properties exhibiting anionic characteristics by forming electrons owing to electrically conductive characteristics depending on LUMO levels.

In addition, pyrene is known to have p-type properties. When pyrene forms a fused ring together with imidazole, pyrrole or pyrazine, it forms a new molecular orbital and thus has much stronger p-type properties than those of pyrene, unlike when pyrene is used alone. The term "p-type properties" as used herein refers to properties exhibiting cationic characteristics by forming holes owing to electrically conductive characteristics depending on HOMO levels.

Specifically, the A portion of the formula 1 is fused with imidazole, pyrrole or pyrazine and thus has amphoteric properties, unlike a conventionally known pyrene. The present inventors have found that the material of the formula (1) having these properties can perform all the functions of hole injection and transportation, electron injection and transportation, and light emission in an organic electronic device including an organic light-emitting device. It has not yet been known that the pyrene derivative having the above-mentioned structure can perform all the above-mentioned functions in an organic electronic device.

In particular, when the substituents larger than benzene are introduced at the B portion, the A and B portions of the formula (1) may has a slightly twisted steric structure. When the compound of the formula (1) has a twisted three-dimensional structure as described above, pi-pi interaction in the structure of the compound is decreased, thereby having effects of suppressing the formation of excited excimer or excited exciplex from materials having a flat structure, such as pyrene.

In the formula (1), the A portion has amphoteric properties and thus the compound of the formula (1) can exhibit stronger n-type or p-type behavior of the whole molecule by introducing various substituents into the B portion. Furthermore, various substituents can be introduced at the positions of $R^2$ to $R^9$ as the substituents in the A portion of the above formula (1) to synthesize a compound having various energy band gaps. Therefore, the compound of the above formula (1) can form compounds that more suitably meet the requirements for the hole-transporting layer, the light-emitting layer, the electron-injecting layer and the electron-transporting layer by means of various substituents. In the invention, a compound having a suitable energy level according to substituents of the compound of the above formula (1), can be selected and used for an organic light-emitting device to thus realize a device with low drive voltage and high light efficiency.

The substituents of the formulas (1) and (2) will be described in detail below.

The alkyl group of $R^0$ and the alkyl group, the alkoxy group and the alkenyl group of $R^1$ to $R^{10}$ in the above formulas (1) and (2) preferably have 1 to 20 carbon atoms.

Examples of the aryl group of $R^0$ to $R^{10}$ in the above formulas (1) and (2) include, but are not limited to, a phenyl group, a naphthyl group, an anthracenyl group, a tetracenyl group, a pentacenyl group, a biphenyl group, a terphenyl group, a pyrenyl group, a perylenyl group and a coronenyl group.

Examples of the arylamine group of $R^1$ to $R^{10}$ in the above formulas (1) and (2) include, but are not limited to, a diphenylamine group, a phenylnaphtylamine group, a ditolylamine group, a phenyltolylamine group, a carbazolyl group and a triphenylamine group.

Examples of the heterocyclic group of $R^1$ to $R^{10}$ in the above formulas (1) and (2) include, but are not limited to, a pyridyl group, an acridinyl group, a thienyl group, an imidazolyl group, an oxazolyl group, a thiazolyl group and a quinolyl group.

Examples of the halogen group of $R^1$ to $R^{10}$ in the above formulas (1) and (2) include fluorine, chlorine, bromine and iodine.

Examples of the silane group of $R^1$ to $R^{10}$ in the above formulas (1) and (2) include, but are not limited to, a silole group and a silylene group.

Examples of the halogen group of $R^1$ to $R^{10}$ in the above formulas (1) and (2) include fluorine, chlorine, bromine and iodine.

When the substituents of $R^1$ to $R^{10}$ in the above formulas (1) and (2) have the other substituents, these substituents can be selected from the group consisting of a hydrogen atom, an alkyl group, an alkoxy group, an alkenyl group, an aryl group, an arylamine group, a heterocyclic group, a silane group, a boron group, an aliphatic cyclic group, an amine group, a nitrile group, a nitro group, a halogen group, an amide group, an ester group and an ether group, and the above-mentioned properties of the compound according to the invention do not vary depending on the kinds of these substituents.

As preferable examples of the formula (1) or (2), the invention provides compounds having a new structure, represented by the formulas (3) to (8).

More specific examples of the compound represented by the formula (3) according to the invention include, but are not limited to, the following compounds:

(3-1)
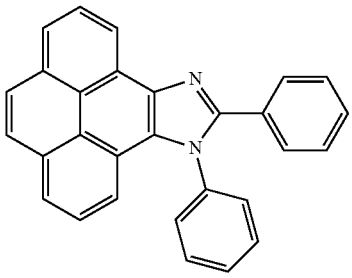
(3-2)
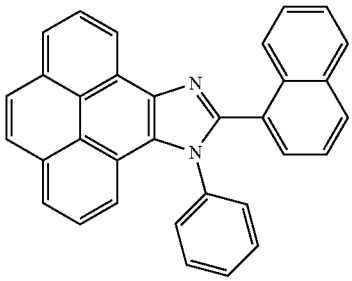
(3-3)
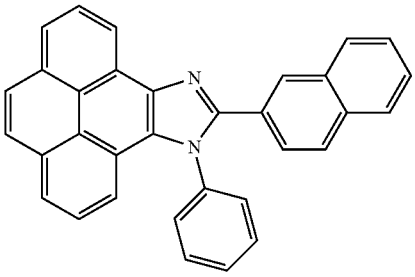
(3-4)
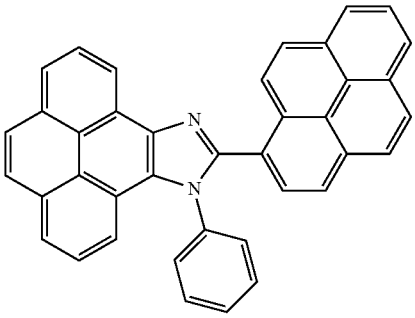
(3-5)
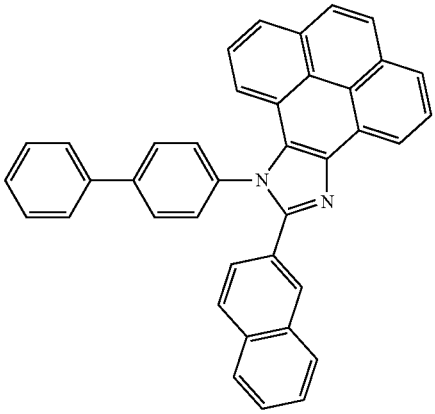
-continued
(3-6)
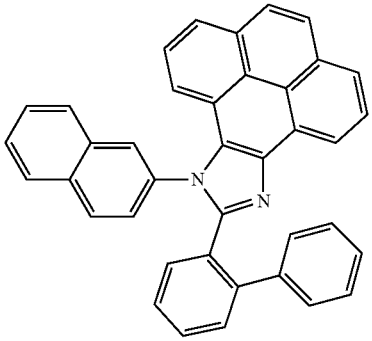
(3-7)
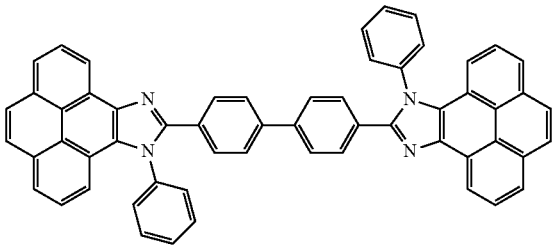
(3-8)
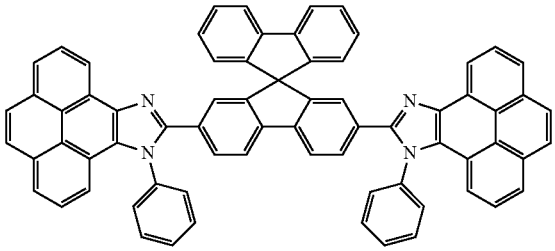
(3-9)
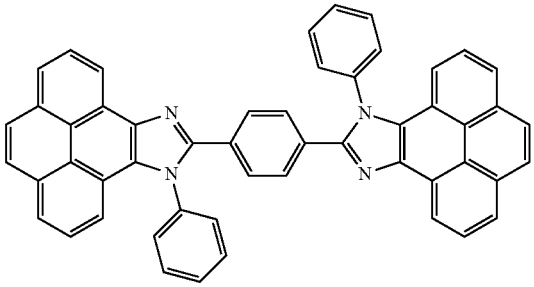
(3-10)
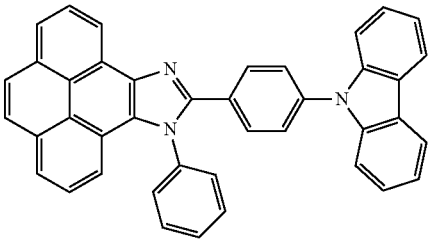

-continued
(3-11)
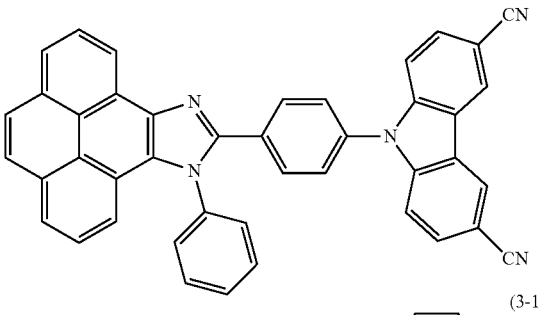
(3-12)
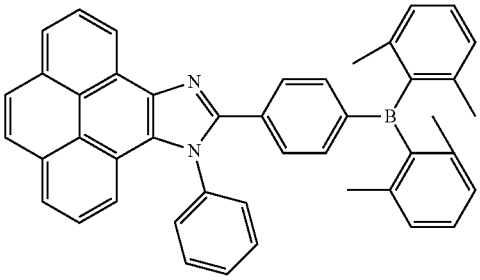
(3-13)
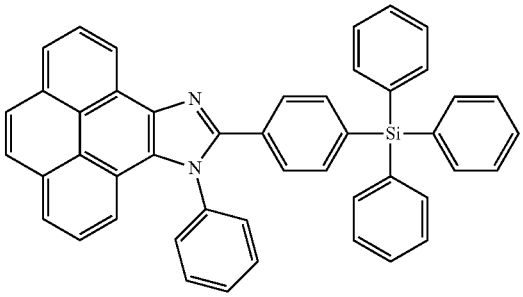
(3-14)
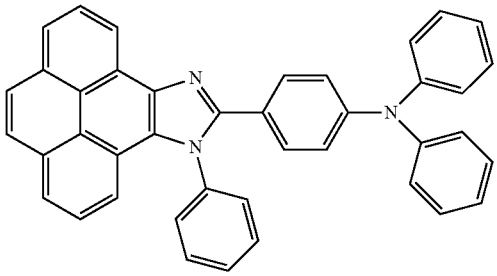
(3-15)
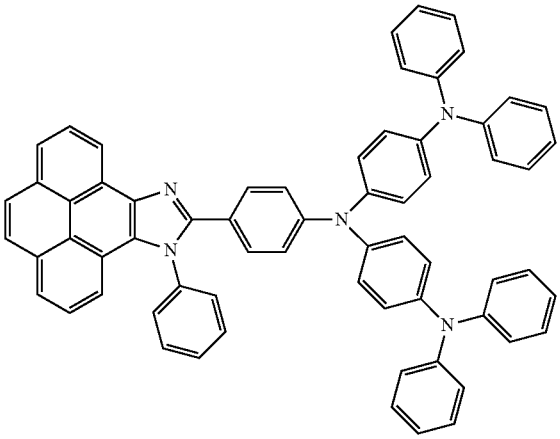
-continued
(3-16)
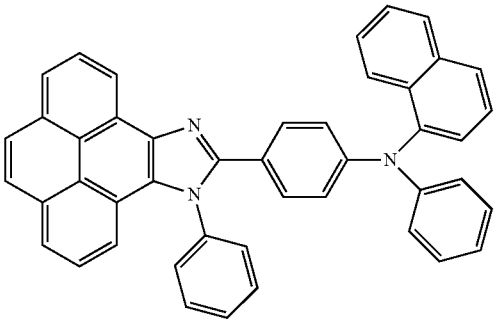
(3-17)
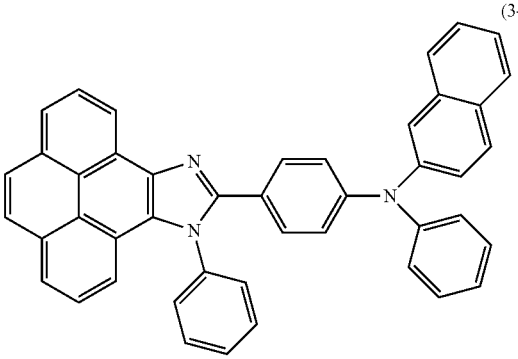
(3-18)
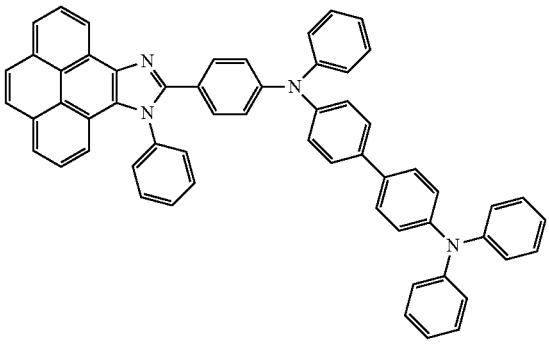
(3-19)
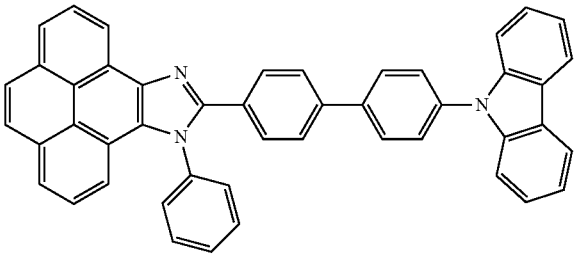
(3-20)
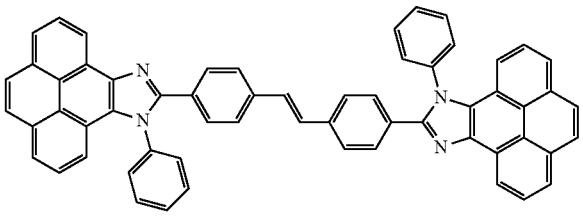

-continued
(3-21)
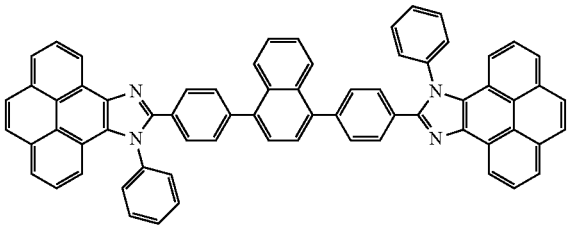
(3-22)
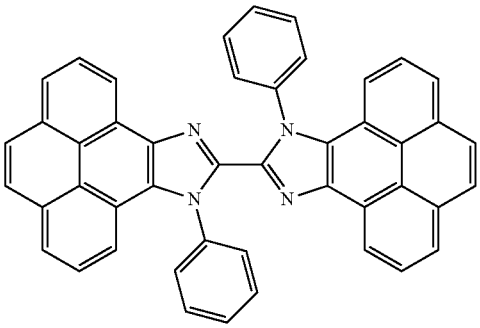
(3-23)
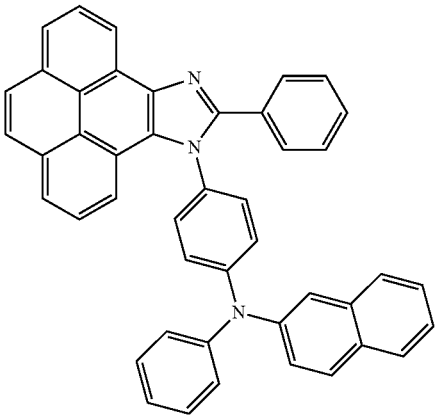
(3-24)
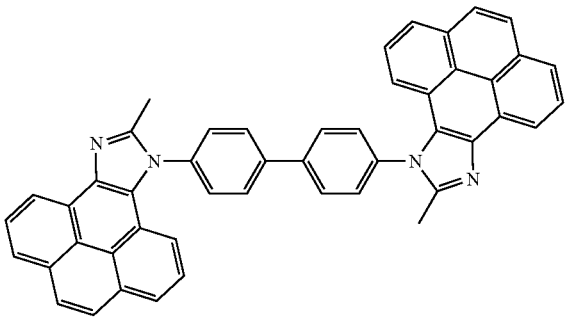
-continued
(3-25)
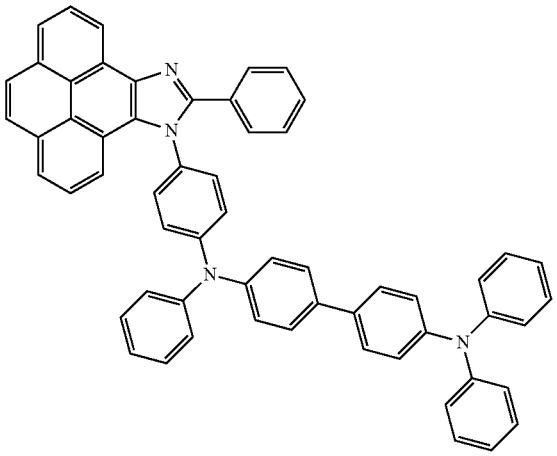
(3-26)
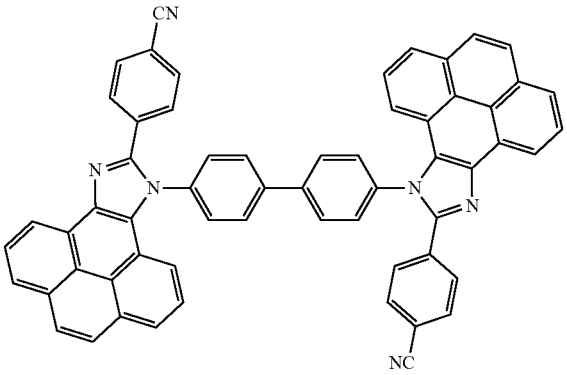
(3-27)
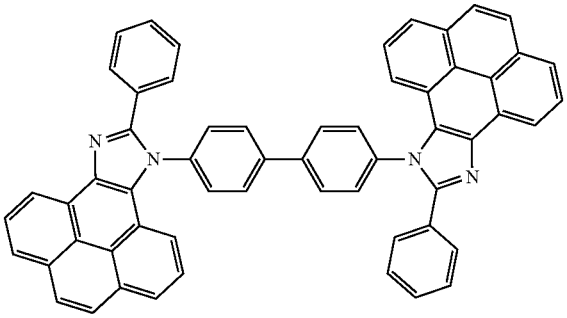
(3-28)
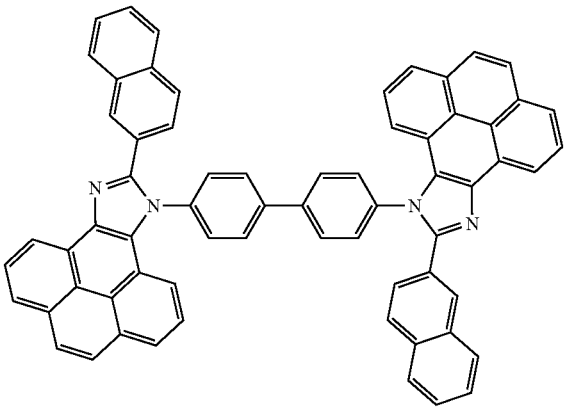

-continued
(3-29)
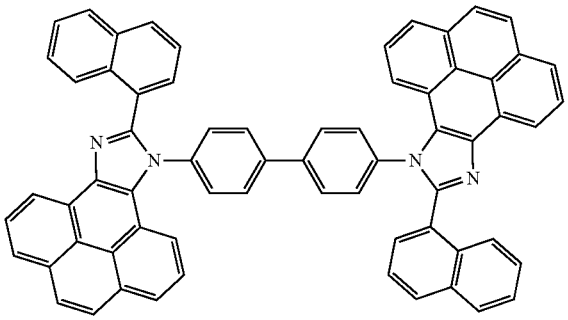
(3-30)
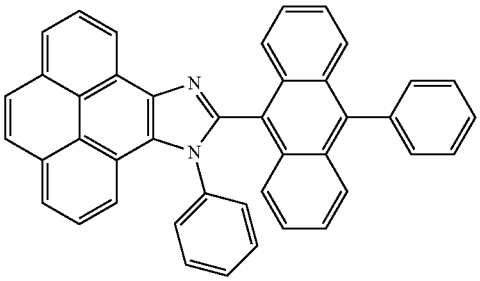
(3-31)
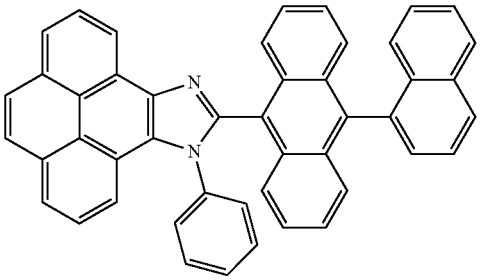
(3-32)
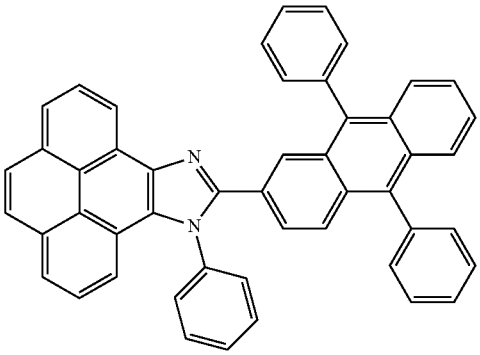
-continued
(3-33)
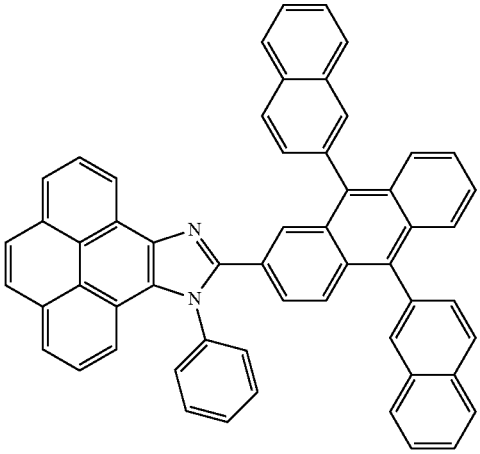
(3-34)
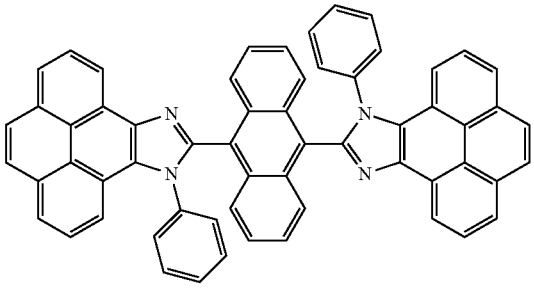
(3-35)
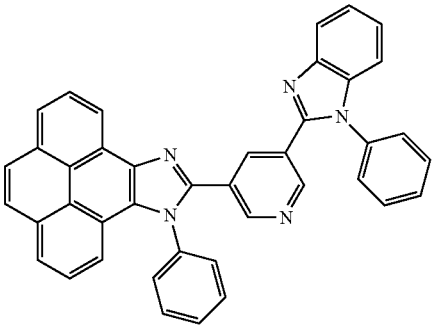
(3-36)
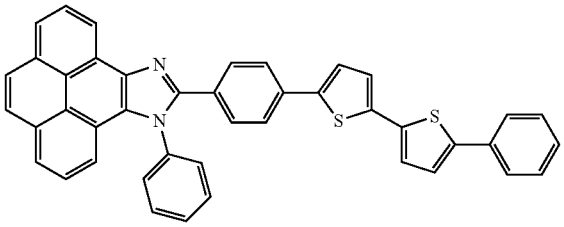
(3-37)
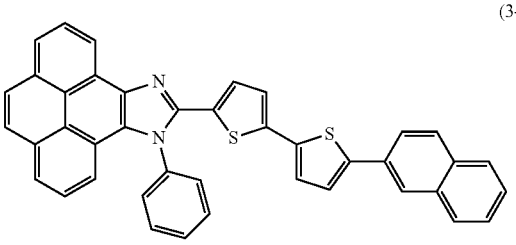

More specific examples of the compound represented by the formula (4) according to the invention include, but are not limited to, the following compounds:
(4-1)
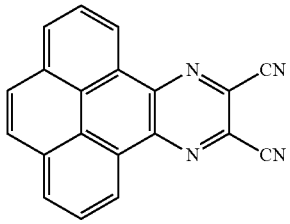
(4-2)
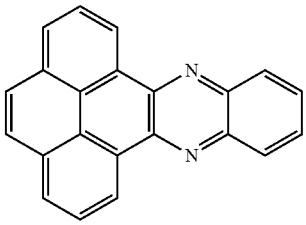
(4-3)
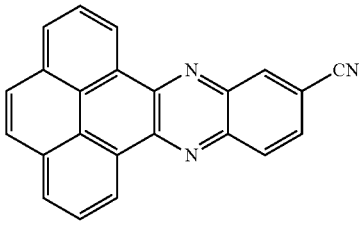
(4-4)
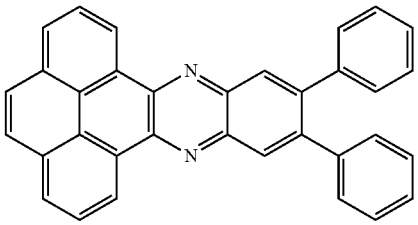
(4-5)
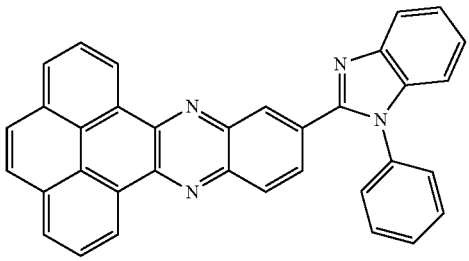
-continued
(4-6)
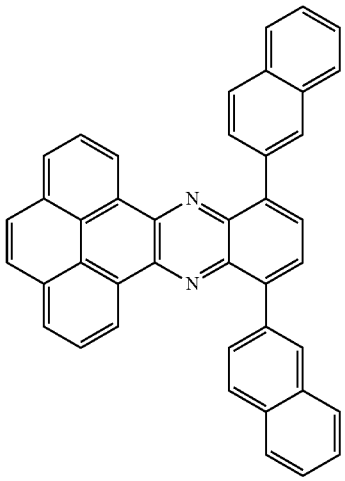
(4-7)
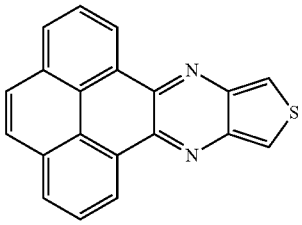
(4-8)
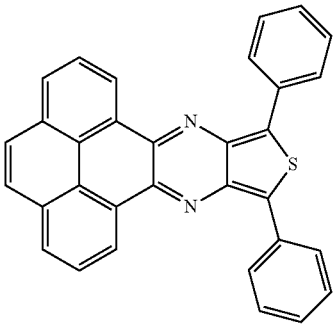
(4-9)
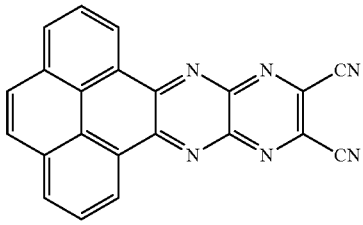
(4-10)
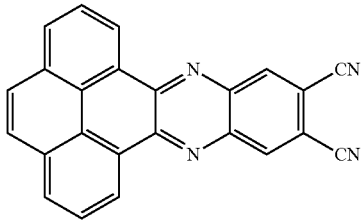
More specific examples of the compound represented by the formula (5) according to the invention include, but are not limited to, the following compounds:

(5-1)
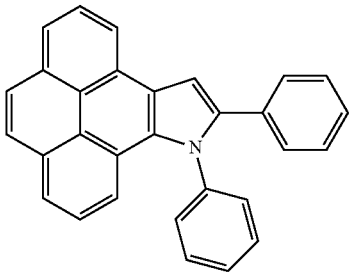
(5-2)
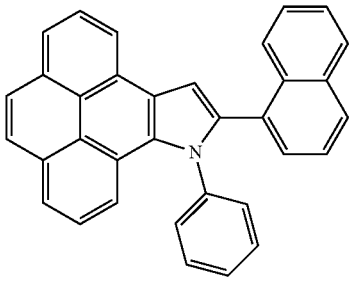
(5-3)
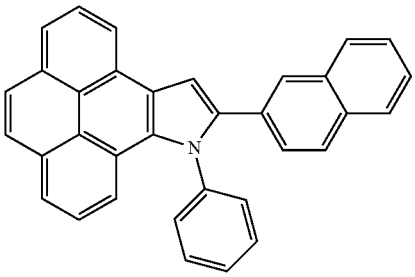
(5-4)
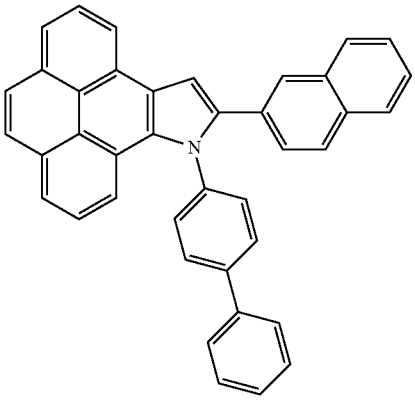
-continued
(5-5)
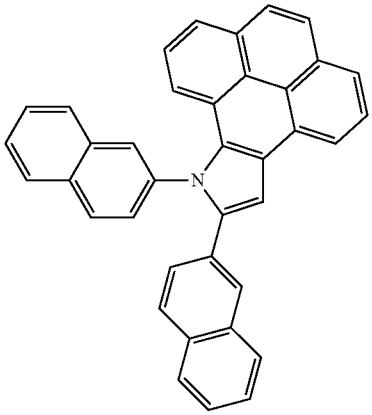
(5-6)
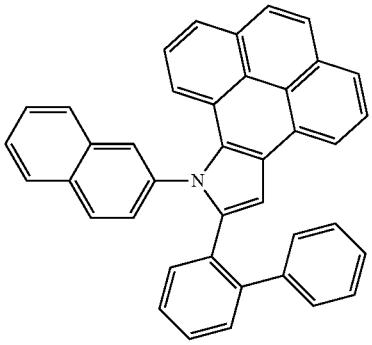
(5-7)
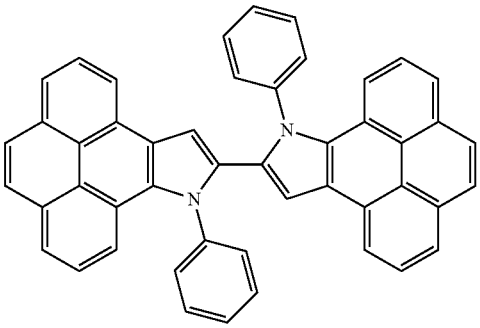
(5-8)
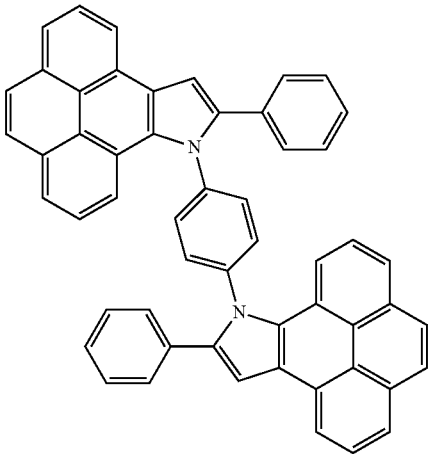

-continued
(5-9)
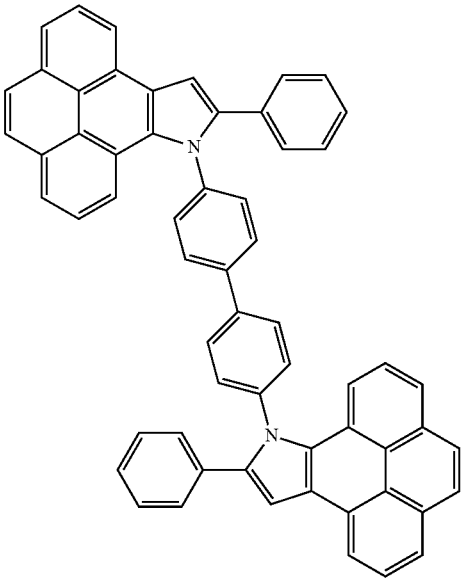
(5-10)
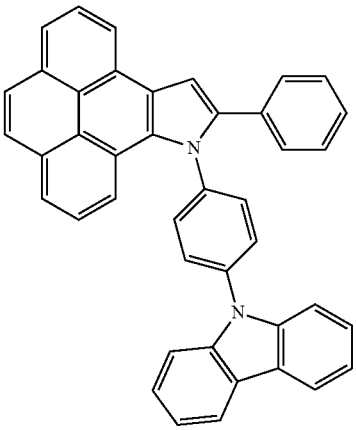
(5-11)
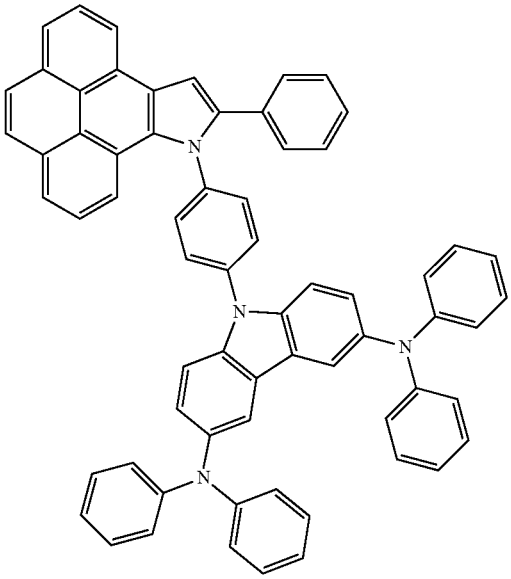
-continued
(5-12)
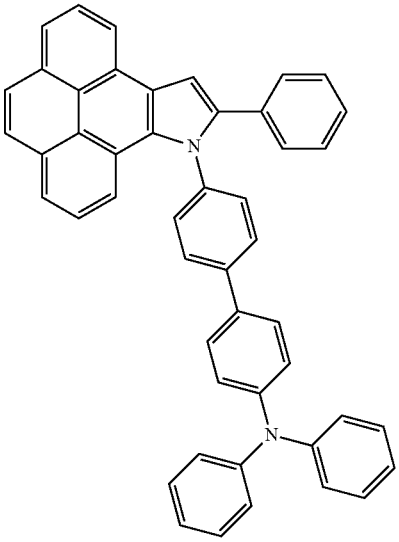
(5-13)
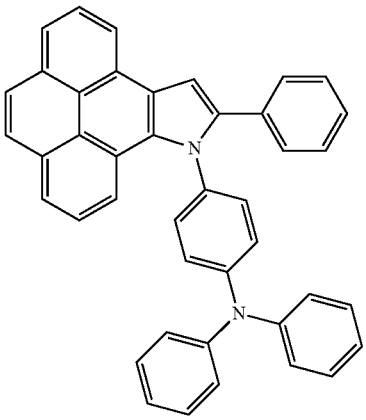
(5-14)
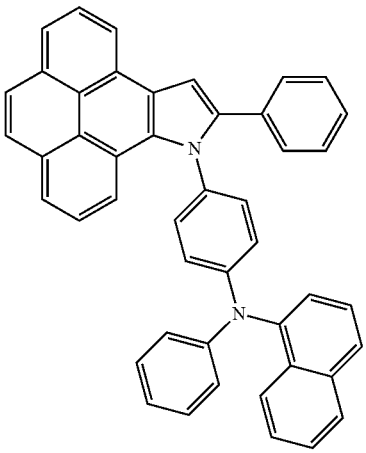

-continued
(5-15)
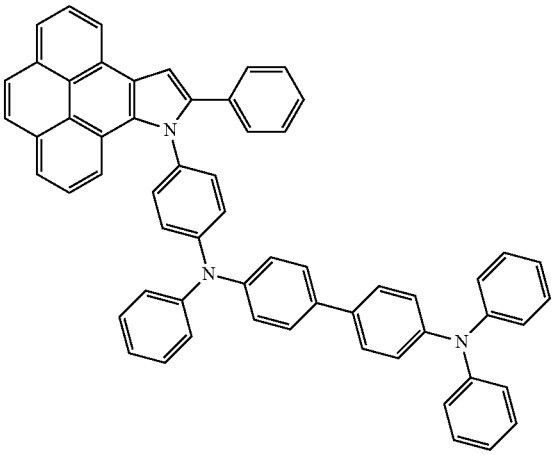
(5-16)
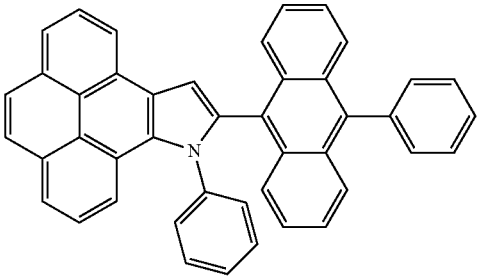
(5-17)
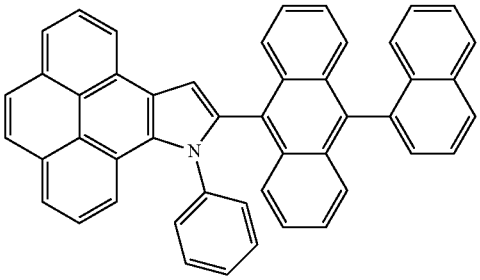
(5-18)
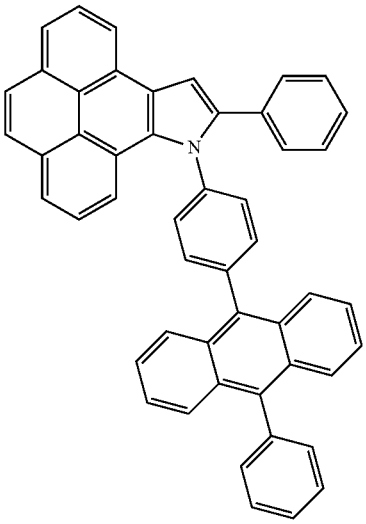
-continued
(5-19)
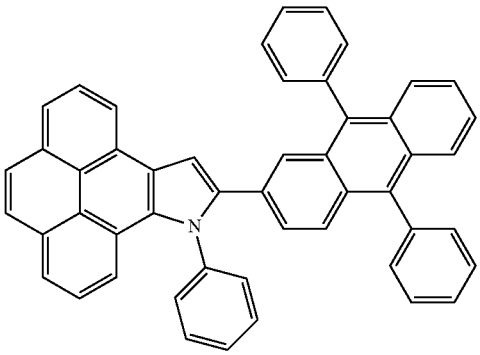
(5-20)
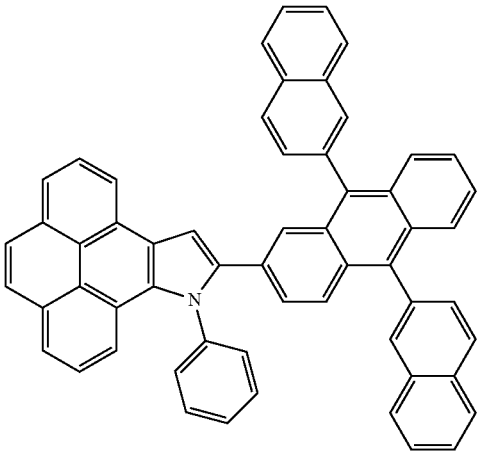
(5-21)
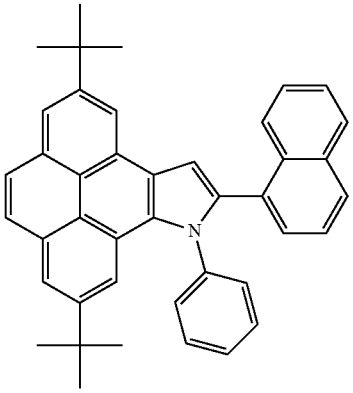
More specific examples of the compound represented by the formula (6) according to the invention include, but are not limited to, the following compounds:

(6-1)
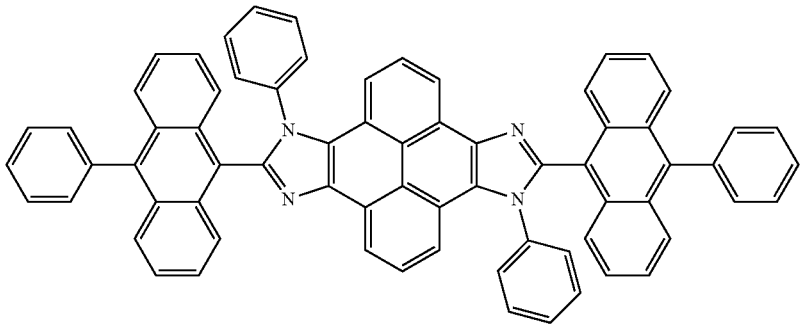
(6-2)
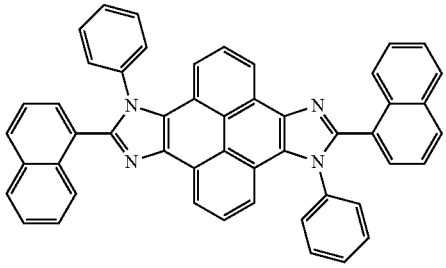
(6-3)
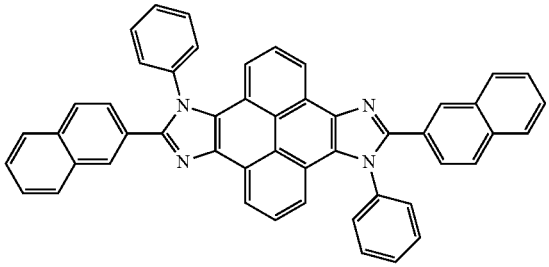
(6-4)
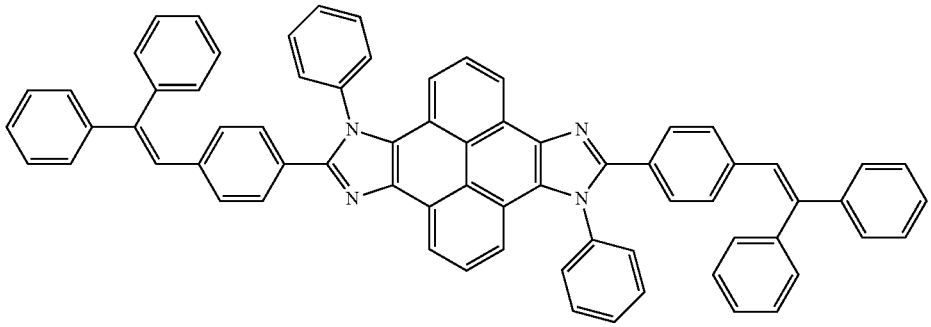
(6-5)
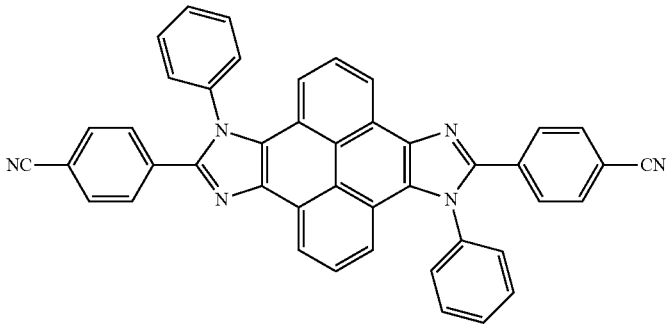
(6-6)
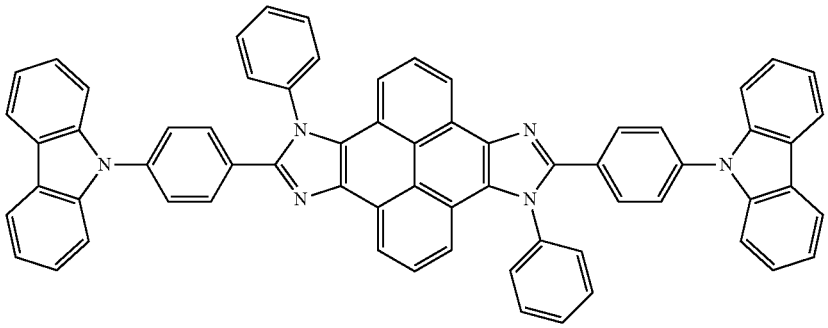

-continued
(6-7)
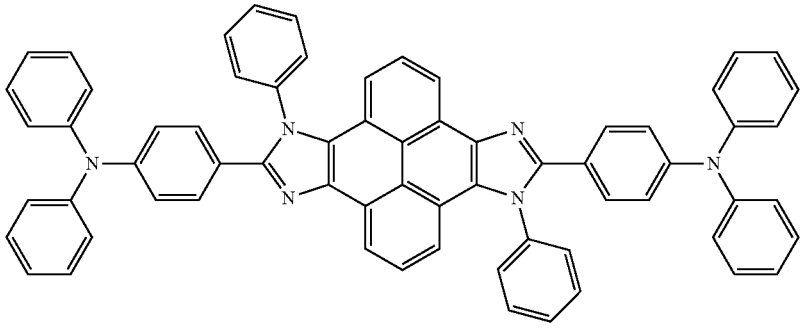
More specific examples of the compound represented by the formula (7) according to the invention include, but are not limited to, the following compounds:
(7-1)
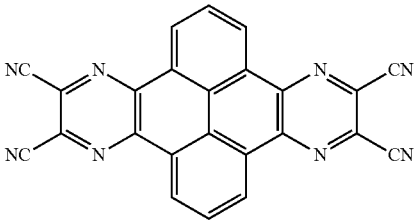
(7-2)
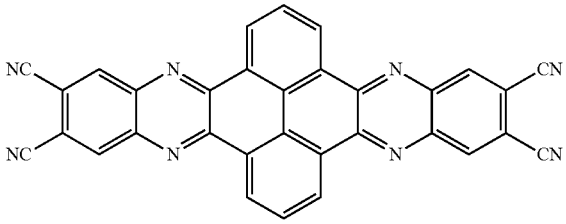
(7-3)
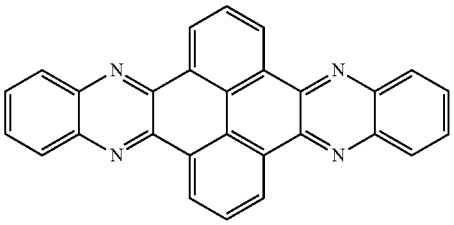
(7-4)
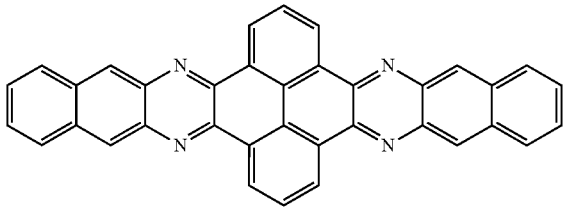
-continued
(7-5)
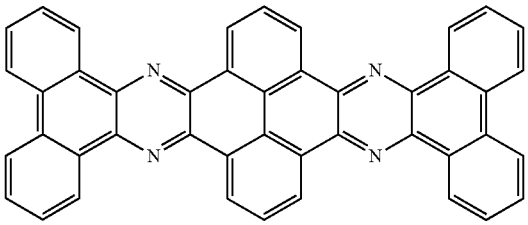
(7-6)
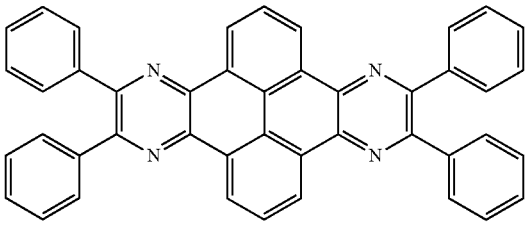
(7-7)
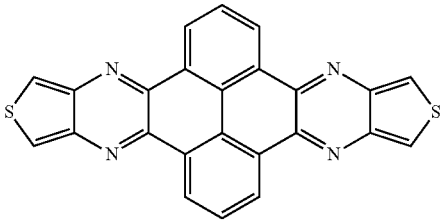
(7-8)
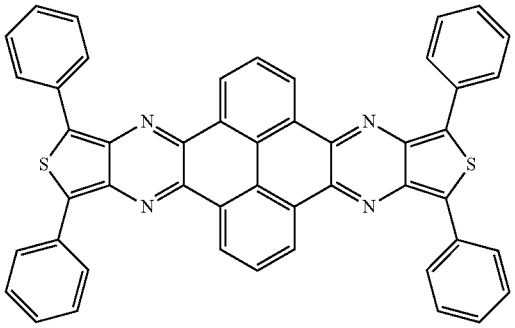

-continued
(7-9)
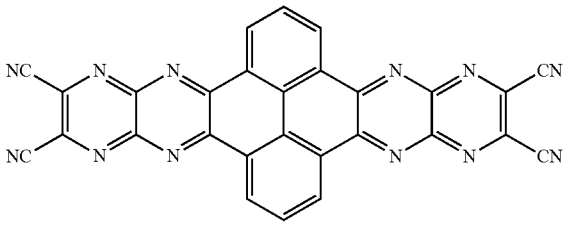
(7-10)
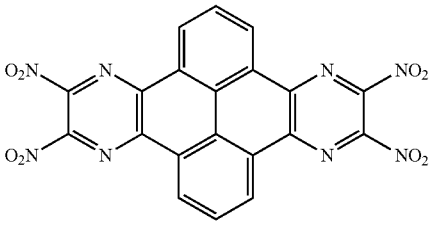
(7-11)
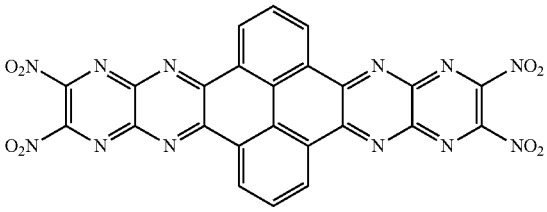
(7-12)
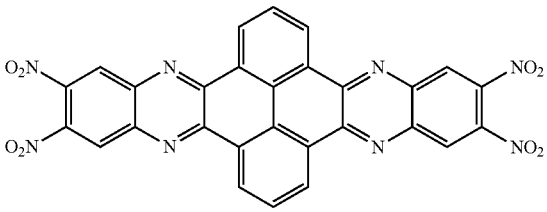
(7-13)
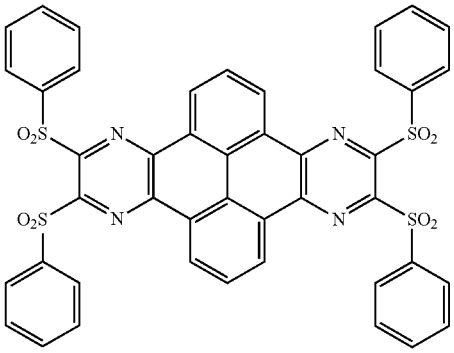
-continued
(7-14)
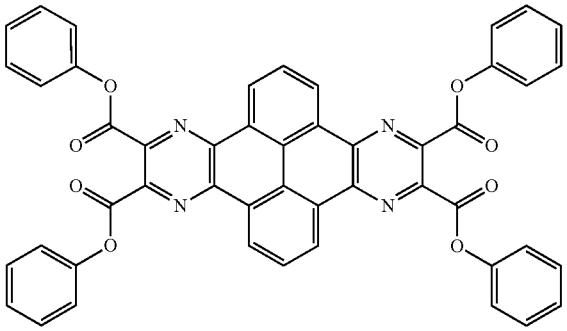
(7-15)
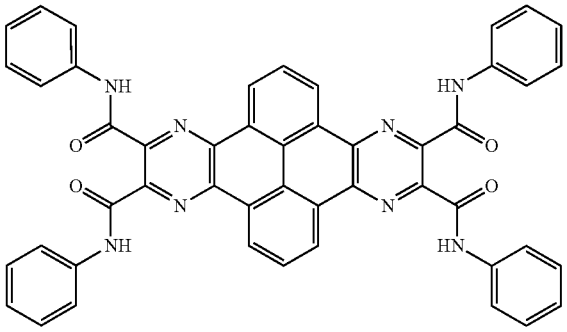
(7-16)
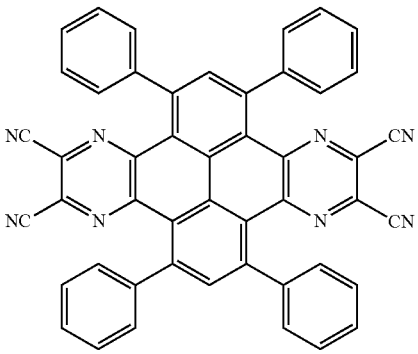
(7-17)
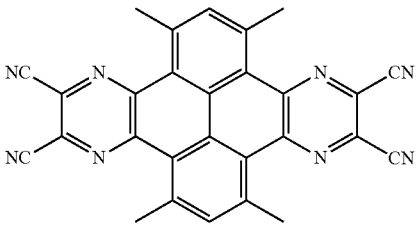

-continued
(7-18)
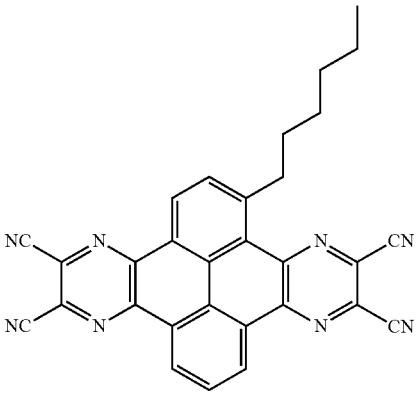
(7-19)
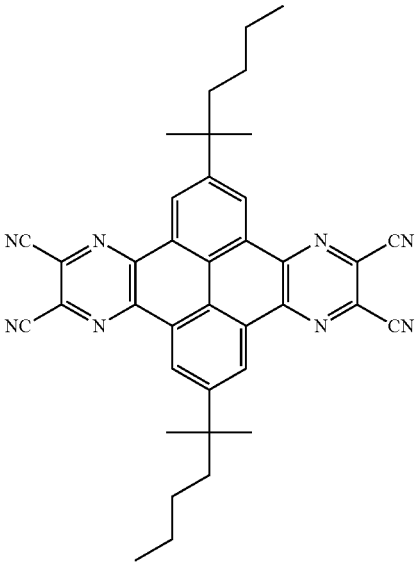
(7-20)
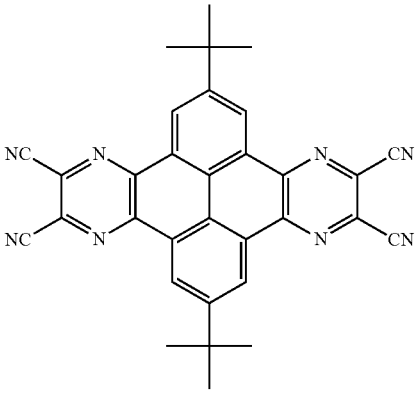
-continued
(7-21)
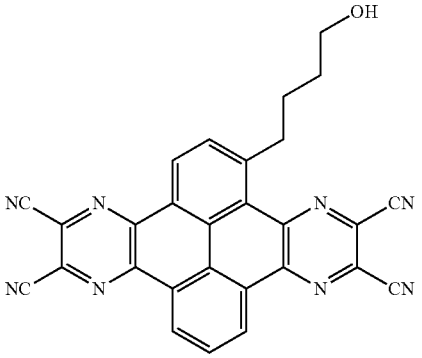
(7-22)
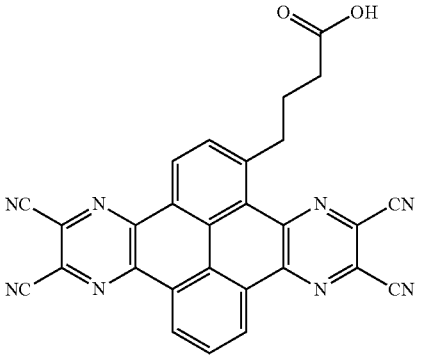
(7-23)
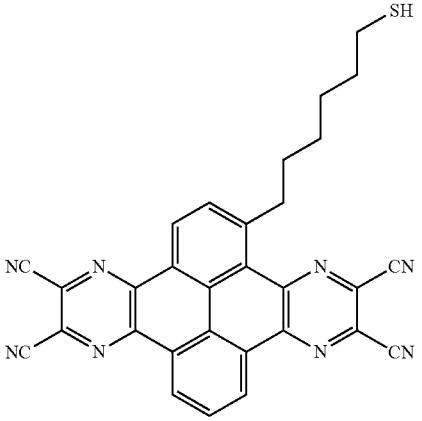
(7-24)
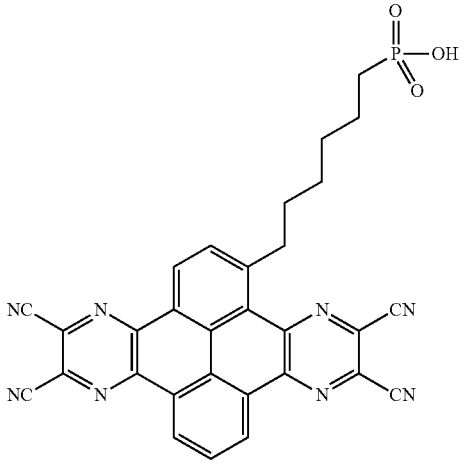

-continued
(7-25)
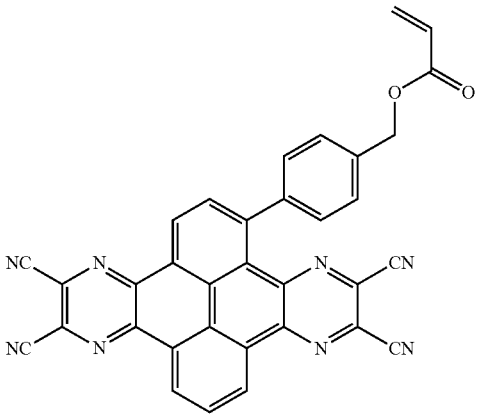
(7-26)
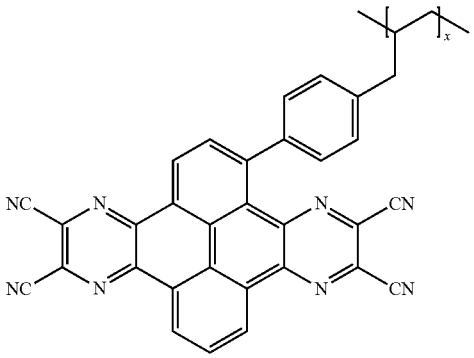
(7-27)
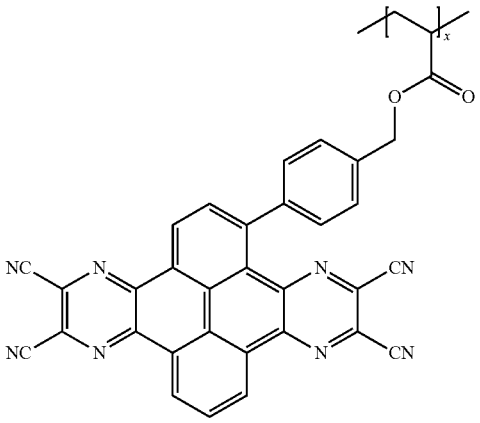
-continued
(7-28)
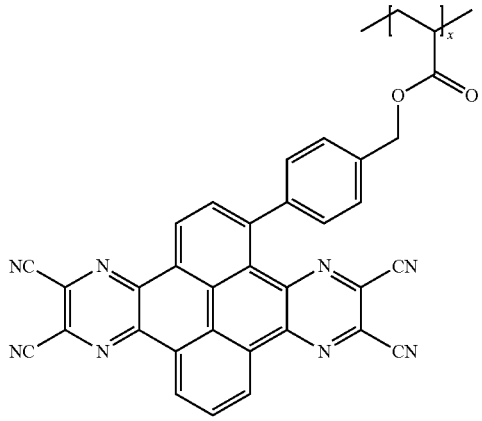
(7-29)
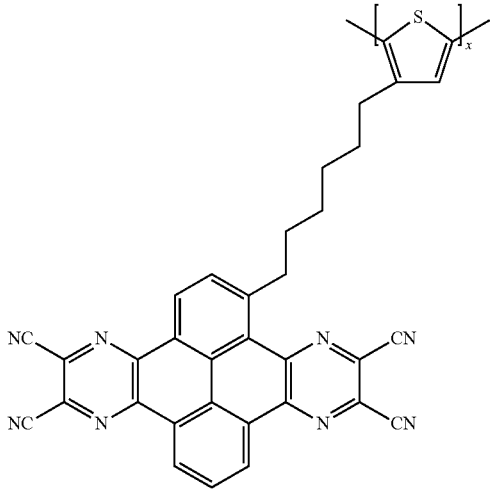
(7-30)
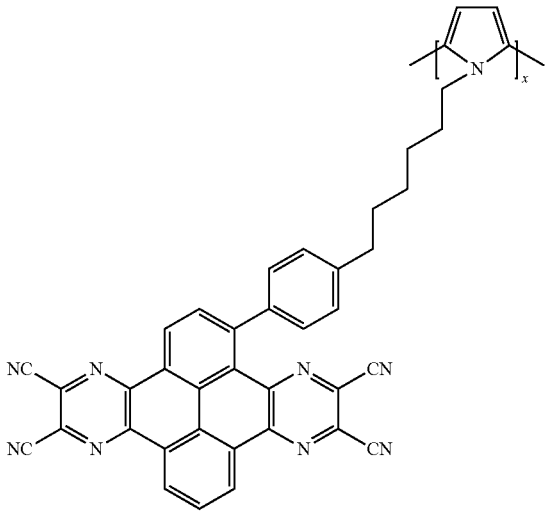

-continued (7-31)

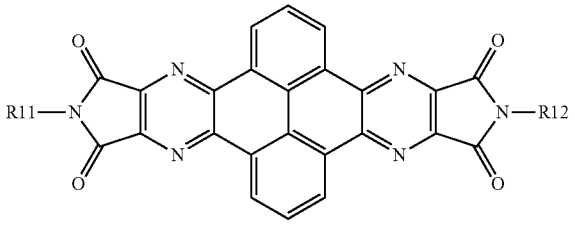

wherein x is an integer of 2 to 10000000; R11 and R12 are each independently a substituted or unsubstituted $C_1$-$C_{60}$ alkyl group or a substituted or unsubstituted $C_1$-$C_{60}$ aryl group.

More specific examples of the compound represented by the formula (8) according to the invention include, but are not limited to, the following compounds:

(8-1)

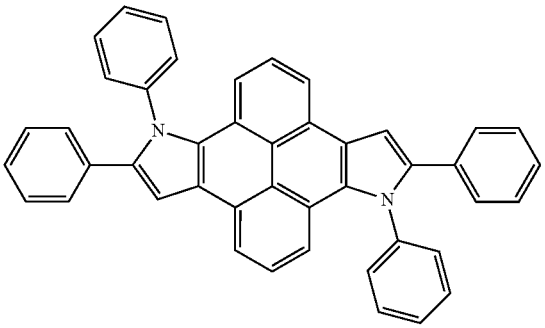

(8-2)

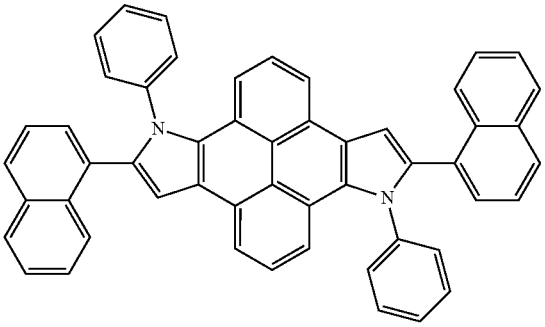

(8-3)

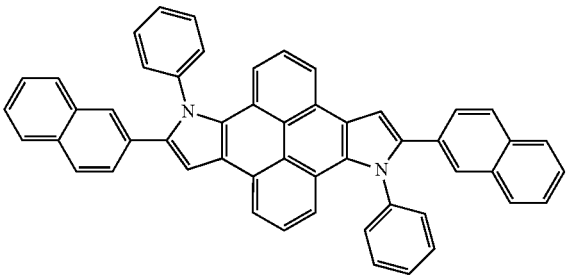

-continued (8-4)

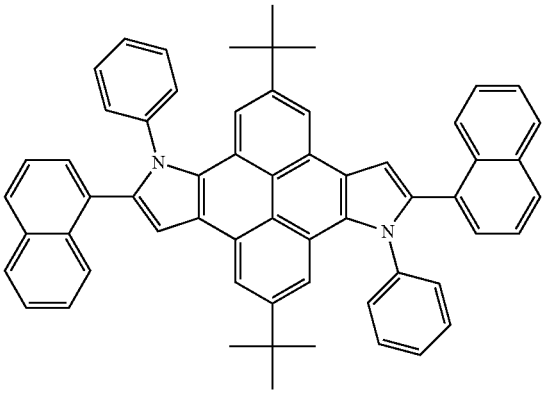

The above-mentioned compounds according to the invention can be prepared as follows.

Pyrene can be oxidized to prepare pyrene-4,5-dione or pyrene-4,5,9,10-dione and then stirred under reflux with an aldehyde and an amine of a substituent to be introduced under acid conditions to prepare a compound of an imidazole system. Further, diamine can be added to pyrene-4,5-dione or pyrene-4,5,9,10-dione and then stirred under reflux under acid conditions to prepare a compound of a pyrazine system. Furthermore, the compound of a pyrrole system can be obtained using a pyrene aldehyde and the appropriate allyl halide can be introduced into an amine group of the prepared compound.

The organic electronic device of the invention can be produced by the general production method of the organic electronic device and materials, except that the above-mentioned compound is used to form one or more organic material layer. Hereinafter, the organic light-emitting device will be illustrated.

In one embodiment of the invention, the organic light-emitting device has a structure comprising a first electrode, a second electrode and an organic material layer arranged therebetween, and can be produced by the general production method of the organic electronic device and materials, except that the compound according to the invention is used in one or more organic material layer of the organic light-emitting device. The structure of the organic light-emitting device according to the invention is illustrated in FIG. 1.

For example, the organic light-emitting device according to the invention can be produced by depositing metals or metal oxides having electrical conductivity, or metal alloys thereof on a substrate to form an anode, forming thereon an organic material layer comprising a hole-injecting layer, a hole-transporting layer, a light-emitting layer and an electron-transporting layer and then depositing on the organic material layer a material capable of using as a cathode, using a PVD (physical vapor deposition) technique such as sputtering and e-beam evaporation. In addition to this method, the organic light-emitting device can be also fabricated by sequentially depositing a cathode material, an organic material layer and an anode material, on the substrate (see International Publication No. WO 03/012890).

The organic material layer may be of a multilayer structure comprising the hole-injecting layer, the hole-transporting layer, the light-emitting layer, the electron-transporting layer and the like, but not limited thereto, and may be of a monolayer structure. Further, the organic material layer can be produced in a smaller number of layers with various polymer materials by using not a vacuum deposition method but a solvent process such as spin coating, dip coating, doctor blade coating, screen printing, inkjet printing, heat transfer method or the like.

The anode materials are preferably materials having large work function for facilitating usually hole injection into the organic material layer. Specific examples of the anode materials usable in the invention include metals such as vanadium, chrome, copper, zinc and gold or alloys thereof; metal oxides such as zinc oxide, indium oxide, indium tin oxide (ITO) and indium zinc oxide (IZO); metal/oxide composites such as ZnO:Al or $SnO_2$:Sb; and conductive polymers such as poly (3-methylthiophene), poly [3,4-(ethylene-1,2-dioxy) thiophene] (PEDT), polypyrrole and polyaniline, but are not limited thereto.

The cathode materials are preferably materials having small work function for facilitating usually electron injection into the organic material layer. Specific examples of the cathode materials include metals such as magnesium, calcium, sodium, potassium, titanium, indium, yttrium, lithium, gadolinium, aluminum, silver, tin and lead or alloys thereof; and multilayered materials such as LiF/Al or $LiO_2$/Al, but are not limited thereto. The hole-injecting material is a material facilitating hole injection from an anode at low voltage. The HOMO (highest occupied molecular orbital) level of the hole-injecting material is preferably located between the work function of the anode materials and the HOMO level of its neighboring organic material layer. Specific examples of the hole-injecting material include metal porphyrin, oligothiophene, arylamine-based organic materials, hexanitrile hexaazatriphenylene, quinacridone-based organic materials, perylene-based organic materials, anthraquinone, and polyaniline-based and polythiophene-based conductive polymers, but are not limited thereto.

The hole-transporting material is suitably a material having high hole mobility, which can transfer holes from the anode and the hole-injecting layer toward the light-emitting layer. Specific examples thereof include arylamine-based organic materials, conductive polymers and block copolymers having both conjugated portions and non-conjugated portions, but are not limited thereto.

The light-emitting material are a material capable of emitting visible light by accepting and recombining holes from the hole-transporting layer and electrons from the electron-transporting layer, preferably a material having high quantum efficiency for fluorescence and phosphorescence. Specific examples thereof include 8-hydroxyquinoline aluminum complex ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene)(PPV)-based polymers; spiro compounds; and polyfluorene and rubrene, but are not limited thereto.

The electron-transporting material is suitably a material having high electron mobility, which can transfer electrons from the cathode to the light-emitting layer. Specific examples thereof include 8-hydroxyquinoline aluminum complex ($Alq_3$); complexes including $Alq_3$; organic radical compounds; and hydroxyflavone-metal complexes, but are not limited thereto.

The organic light-emitting device according to the invention may be of a front-side, backside or double-sided light emission according to the materials used.

The compound according to the invention can function in an organic electronic device including an organic solar cell, an organic photoconductor and an organic transistor, according to a principle similar to that applied to the organic light-emitting device.

[Mode for Invention]

Hereinafter, the present invention will be described in more detail by means of Synthesis Examples and Experimental Examples, but the scope of the invention is not limited thereto.

SYNTHESIS EXAMPLE 1

Synthesis of Formula (3-3)

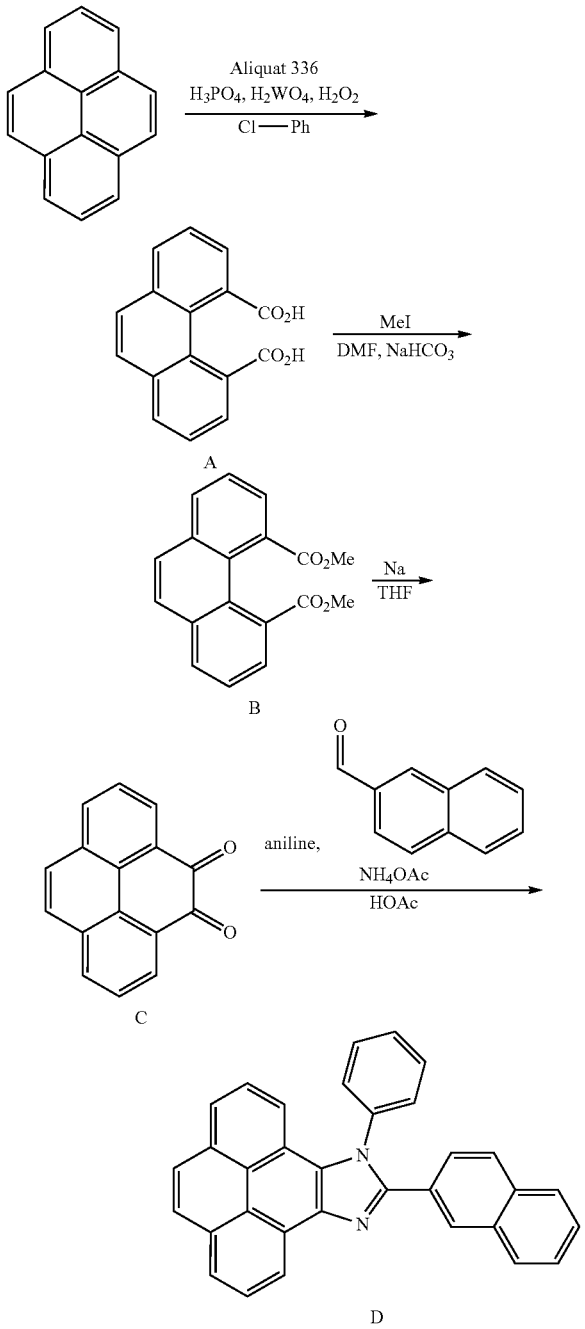

1-1. Synthesis of Compound A

To chlorobenzene (30 ml) were added pyrene (10.0 g, 49.3 mmol), tungstic acid ($H_2WO_4$, 510 mg, 2.05 mmol), Aliquat 336 (0.8 mL, 1.95 mmol), phosphoric acid ($H_3PO_4$, 85%, 0.058 mL) and the reaction solution was stirred. Hydrogen peroxide ($H_2O_2$, 28%, 56 mL) was slowly added dropwise to this solution and the reaction mixture was heated for 6 hours. The obtained solution was cooled to 0° C. and filtered to separate the precipitate. The precipitate was dissolved in 1.25 M sodium hydroxide (NaOH, 700 mL) and thereto was added activated charcoal to decolorize the solution. The solution was neutralized with acetic acid, and the resulting solid was filtered under reduced pressure and then dried in vacuo to prepare the compound A (12 g, 91%). MS: $[M+H]^+$=267.

1-2. Synthesis of Compound B

The compound A (10 g, 37.6 mmol) and sodium hydrogen carbonate ($NaHCO_3$, 16.4 g, 194 mmol) were dissolved in dimethylformamide (DMF, 200 mL), thereto was added methyl iodide (MeI, 30 mL) and then the reaction mixture was stirred at room temperature for 20 hours. The reactants were diluted with ethyl acetate and washed with water. Subsequently, anhydrous magnesium sulfate ($MgSO_4$) was added to the reaction solution to remove moisture and the solvent was removed under reduced pressure. The obtained compound was passed through a silica gel column with hexane/ethyl acetate (4:1) as an eluent, and then the solvent was removed under reduced pressure and the obtained compound was dried in vacuo to prepare the compound B (10.3 g, 88%) as a solid. MS: $[M+H]^+$=295.

1-3. Synthesis of Compound C

Sodium (Na, 1.9 g, 79 mmol), the compound B (6 g, 20.4 mmol) and tetrahydrofuran (THF, 150 mL) were heated for 6 hours under nitrogen. The unreacted sodium was carefully removed with MeOH and $H_2O$. Subsequently, the reactants were diluted with ethyl acetate and washed with water, and then anhydrous magnesium sulfate ($MgSO_4$) was added to the reaction solution to remove moisture and the solvent was removed under reduced pressure. The obtained compound was passed through a silica gel column with hexane/ethyl acetate (4:1) as an eluent, and then the solvent was removed under reduced pressure and the obtained compound was dried in vacuo to prepare the desired compound C (4.5 g, 95%) as a solid. MS: $[M+H]^+$=233.

1-4. Synthesis of Compound D (Formula (3-3))

The compound C (1 g, 4.3 mmol), aniline (2 g, 21.5 mmol), 2-naphthalaldehyde (0.672 g, 4.3 mmol), ammonium acetate (0.497 g, 6.45 mmol), 10 mL of toluene and 10 mL of acetic acid were heated for 4 hours. The reaction mixture was cooled to room temperature. The resulting solid was filtered and washed with ethanol and water to obtain the compound D represented by the formula (3-3) (1.34 g, yield 70%) MS $[M+H]^+$=445. 1H NMR (300 MHz, DMSO-$d_6$): 7.29-7.34 (m, 5H), 7.54 (d, 1H), 7.65-7.73(m, 5H), 7.80-7.89(m, 5H), 8.12 (d, 2H)

SYNTHESIS EXAMPLE 2

Synthesis of Formula (3-4)

The compound C (1 g, 4.3 mmol), aniline (2 g, 21.5 mmol), 1-pyrenecarboxyaldehyde (0.991 g, 4.3 mmol), ammonium acetate (0.497 g, 6.45 mmol), 10 mL of toluene and 10 mL of acetic acid were heated for 4 hours. The reaction mixture was cooled to room temperature. The resulting solid was filtered and washed with ethanol and water to obtain the compound represented by the formula (3-4) (1.45 g, yield 65%). MS $[M+H]^+$=519. 1H NMR (300 MHz, DMSO-$d_6$): 7.28-7.32 (m, 5H), 7.68-7.73 (m, 6H), 7.88-7.82 (m, 6H), 8.04-8.18 (m, 5H)

SYNTHESIS EXAMPLE 3

Synthesis of Formula (3-10)

The compound C (1 g, 4.3 mmol), aniline (2 g, 21.5 mmol), terephthalaldehyde (0.289 g, 2.2 mmol), ammonium acetate (0.497 g, 6.45 mmol), 10 mL of toluene and 10 mL of acetic acid were heated for 4 hours. The reaction mixture was cooled to room temperature. The resulting solid was filtered and washed with ethanol and water to obtain the compound represented by the formula (3-10) (0.92 g, yield 60%). MS $[M+H]^+$=711. 1H NMR (300 MHz, DMSO-$d_6$): 7.0-7.08 (m, 4H), 7.28-7.32 (m, 7H), 7.4 (d, 2H), 7.5-7.53 (m, 4H), 7.68-7.73 (m, 2H), 7.88-7.82 (m, 4H), 8.08-8.12 (m, 2H)

SYNTHESIS EXAMPLE 4

Synthesis of Formula (4-1)

The compound C (2.32 g, 10 mmol), diaminomalenitrile (1.08 g, 10 mmol) and 10 mL of acetic acid were heated overnight. The reaction mixture was cooled to room temperature. The resulting solid was filtered and washed with ethanol and water to obtain the compound represented by the formula (4-1) (2.43 g, yield 80%). MS $[M+H]^+$=306.

SYNTHESIS EXAMPLE 5

Synthesis of Formula (5-21)

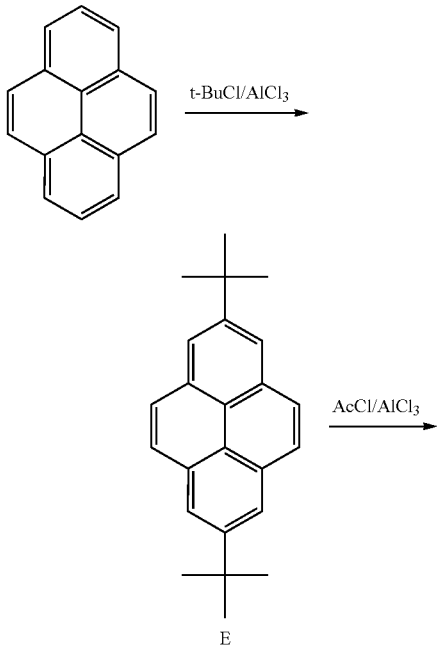

-continued

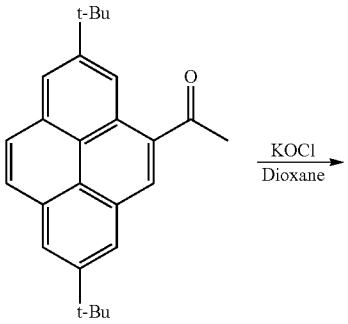

F

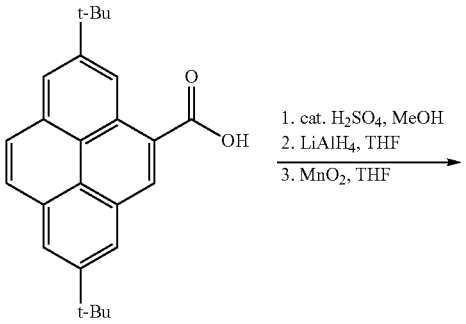

G

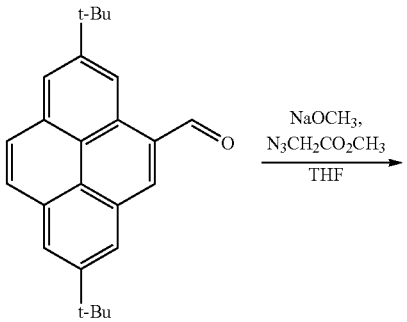

H

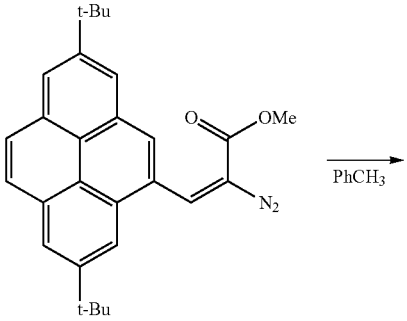

I

-continued

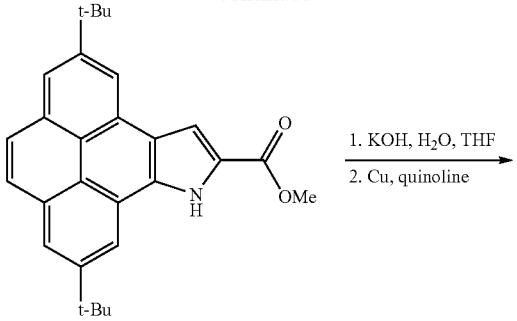

J

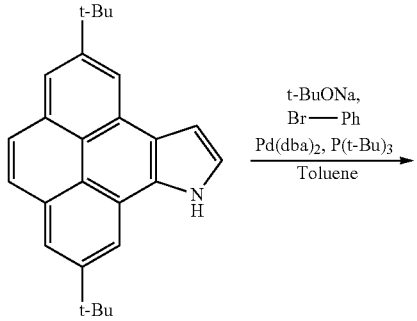

K

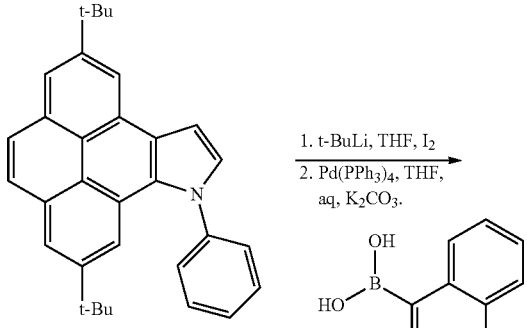

L

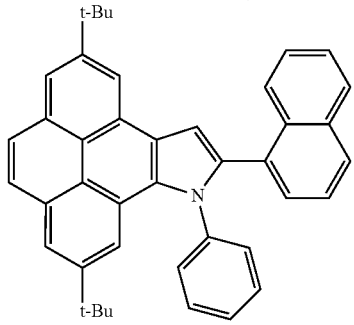

M 5-1. Synthesis of Compound E

Pyrene (8.0 g, 40.0 mmol) was dissolved in 200 mL of tert-butyl chloride (t-BuCl) and thereto was added aluminum chloride ($AlCl_3$, 8.0 g, 60.0 mmol) at 0° C. The reaction solution was stirred at room temperature for 3 hours and then poured into iced water to terminate the reaction. The reaction solution was extracted with methylene chloride ($CH_2Cl_2$), dried over anhydrous magnesium sulfate, concentrated under reduced pressure and then passed through a column with hexane to obtain the compound E (10.0 g, 86%) as a colorless solid. MS: $[M+H]^+$=315.

5-2. Synthesis of Compound F

The compound E (10.0 g, 32.0 mmol) was dissolved in 300 mL of methylene chloride ($CH_2Cl_2$). To the reaction solution was added aluminum chloride ($AlCl_3$, 8.0 g, 60.0 mmol) and then acetyl chloride ($CH_3COCl$, 5 g, 64 mmol) at −5° C. The reaction solution was stirred at room temperature for 12 hours and then poured into iced water to terminate the reaction. The reaction solution was extracted with methylene chloride ($CH_2Cl_2$), dried over anhydrous magnesium sulfate, concentrated under reduced pressure and then passed through a column with hexane/benzene (1:1) to obtain the compound F (4.4 g, 40%). MS: $[M+H]^+$=357.

5-3. Synthesis of Compound G 35 mL of distilled water was maintained at 70° C. and thereto was added calcium hypochlorite ($Ca(OCl)_2$, 18 g, 12.5 mmol). Thereto was added a mixed solution of potassium hydroxide (KOH, 3.7 g, 66 mmol) and potassium carbonate ($K_2CO_3$, 13 g, 94 mmol) dissolved in 60 mL of distilled water. To the potassium hypochlorite (KOCl) solution thus obtained was added the compound F (6.4 g, 18 mmol) dissolved in 90 mL of dioxane. This mixed solution was stirred under reflux for 1 hour and cooled to room temperature. To the solution were added distilled water (50 mL) and methylene chloride (50 mL) to separate into an organic layer and an aqueous layer. Then, the organic layer was removed and to the remaining aqueous layer was added a 10% hydrochloric acid solution to acidify to pH 1. The resulting solid was filtered, washed with water and dried to obtain the compound G (4.5 g, 72%). MS: $[M+H]^+$=359.

5-4. Synthesis of Compound H

The compound G (4.4 g, 12.4 mmol) was dissolved in 500 mL of methanol and thereto was added 5 mL of sulfuric acid. The reaction solution was stirred under reflux for 12 hours and cooled to room temperature. To the solution were added chloroform and distilled water to separate into an organic layer and an aqueous layer. Then, the aqueous layer was removed and anhydrous sodium sulfate ($Na_2SO_4$) was added to the organic layer to remove moisture and the solvent was removed under reduced pressure. The obtained compound was passed through a silica gel column with hexane/benzene (1:1) as an eluent, and then the solvent was removed under reduced pressure and the obtained compound was dried in vacuo to prepare the desired compound (4.16 g, 90%). MS: $[M+H]^+$=373.

The obtained compound (4.16 g, 11.2 mmol) was dissolved in 100 mL of tetrahydrofuran (THF) and thereto was added $LiAlH_4$ (1.37 g, 36 mmol). The reaction solution was stirred at room temperature for 3 hours and cooled to 0° C., and then thereto was added a small amount of ethyl acetate ($CH_3CO_2CH_2CH_3$) to remove the remaining $LiAlH_4$. The reaction solution was poured into iced water to terminate the reaction. Then, the reaction solution was extracted with methylene chloride ($CH_2Cl_2$), dried over anhydrous magnesium sulfate, concentrated under reduced pressure and then recrystallized from chloroform to obtain an alcohol type compound (3.3 g, 83%). MS: [M+H]+=345.

The obtained alcohol type compound (3.3 g, 9.6 mmol) was dissolved in 300 mL of methylene chloride and thereto was added $MnO_2$ (1.7 g, 20 mmol). The reaction solution was stirred at room temperature for 3 hours and filtered through Celite, and then the solvent was removed under reduced pressure. The obtained compound was passed through a silica gel column with ethyl acetate/hexane (1:3) as an eluent, and then the solvent was removed under reduced pressure and the obtained compound was dried in vacuo to prepare the desired compound H (2.7 g, 82%). MS: $[M+H]^+$=343.

5-5. Synthesis of Compound I

Sodium methoxide (NaOMe, 2.16 g, 40 mmol) was added to 30 mL of methanol and the reaction solution was maintained at −15° C. To the reaction solution was added a solution of the compound H (3.4 g, 10 mmol) and methyl azidoacetate ($N_3CH_2CO_2CH_3$, 4.6 g, 40 mmol) dissolved in 40 mL of THF. The reaction solution was stirred for 3 hours while maintaining the temperature at −15° C. and then stirred at 0° C. for 3 hours. This mixed solution was poured into iced water and stirred for 10 minutes, and then the resulting solid was filtered, washed with water and dried to obtain the compound 1 (3.82 g, 87%). MS: $[M+H]^+$=440.

5-6. Synthesis of Compound J

The compound I (3.5 g, 8 mmol) was dissolved in 200 mL of toluene and the reaction solution was stirred under reflux for 3 hours. The reaction solution was stirred under reflux for further 1 hour from the time that nitrogen is no longer released and cooled to room temperature. The resulting solid was filtered and dried to obtain the compound J (1.48 g, 45%). MS: $[M+H]^+$=412.

5-7. Synthesis of Compound K

The compound J (1.2 g, 3 mmol) was dispersed in 100 mL of tetrahydrofuran (THF) and 30 mL of distilled water, thereto was added KOH (449 mg, 8 mmol) and then the reaction solution was stirred under reflux for 2 hours. The reaction solution was cooled to room temperature. Then, THF was removed under reduced pressure and the remaining solution was acidified with 6 N HCl. The resulting solid was filtered, washed with distilled water and dried to obtain an acid type compound (1.1 g, 97%). MS: $[M+H]^+$=398.

The obtained acid type compound (1.1 g, 2.9 mmol) and Cu powders (135 mg) were dispersed in 15 mL of quinoline and heated at 220° C. for 2 hours. The reaction solution was cooled to room temperature and then Cu powders were filtered off. The remaining filtrate was poured into iced water and adjusted to pH 4 with 2 N HCl. The filtrate was extracted with methylene chloride, dried over anhydrous sodium sulfate, concentrated under reduced pressure and passed through a column with ethyl acetate/hexane (1:4) to obtain the compound K (950 mg, 92%). MS: $[M+H]^+$=354.

5-8. Synthesis of Compound L

The compound K (710 mg, 2.0 mmol), bromobenzene (0.31 g, 2 mmol), t-BuONa (0.77 g, 8 mmol), $Pd(dba)_2$ (23 mg, 0.02 mol%) and $P(t\text{-}Bu)_3$ (10 mg, 0.02 mol%) were dissolved in 40 mL of toluene and then the reaction solution was stirred under reflux for 1 hour. The reaction solution was cooled to room temperature and thereto were added distilled water and methylene chloride to separate into an organic layer and an aqueous layer. Then, the aqueous layer was removed, and only the organic layer was taken, dried over anhydrous sodium sulfate and filtered, and then the solvent was removed under reduced pressure. The obtained compound was passed through a silica gel column with tetrahydrofuran/hexane (1:3) as an eluent, and then the solvent was removed under reduced pressure and the obtained compound was dried in vacuo to prepare the desired compound L (600 mg, 70%). MS: $[M+H]^+$=430.

5-9. Synthesis of Compound M (Formula (5-21))

The compound L (4.30 g, 10.0 mmol) was dissolved in 100 mL of THF and the reaction solution was maintained at −78° C. under an argon atmosphere. To this solution was slowly added 1.6 M t-BuLi (7 mL, 11.0 mmol) and the mixture was stirred at −78° C. for 3 hours. Iodine ($I_2$, 3.1 g, 12.0 mmol) was slowly added thereto while maintaining the temperature and the resulting mixture was stirred at −78° C. for 2 hours. The resulting mixture was heated to room temperature and iced water was poured thereinto to filter the resulting solid. The solid was passed through a silica gel column with tetrahydrofuran/hexane (1:2) as an eluent, and then the solvent was removed under reduced pressure and the solid was dried in vacuo to prepare the desired compound (4.8 g, 87%). MS: $[M+H]^+$=556.

The compound (555 mg, 1.0 mmol) obtained above, 1-naphthylboronic acid (172 mg, 1.0 mmol) and sodium carbonate (234 mg, 22.1 mmol) was suspended in a mixture of THF (20 mL), ethanol (3 mL) and water (10 mL). To the suspension was added tetrakis(triphenylphosphine)palladium (25 mg, 0.022 mmol). The mixture was stirred under reflux for about 24 hours and then the refluxed mixture was cooled to room temperature. The organic layer was separated and washed with water, and the aqueous layer was extracted with chloroform. The organic extracts were dried over magnesium sulfate, concentrated in vacuo and subjected to column purification to obtain the compound M (440 mg, 80%). MS $[M+H]^+$=556.

SYNTHESIS EXAMPLE 6

Synthesis of Formula 6-2

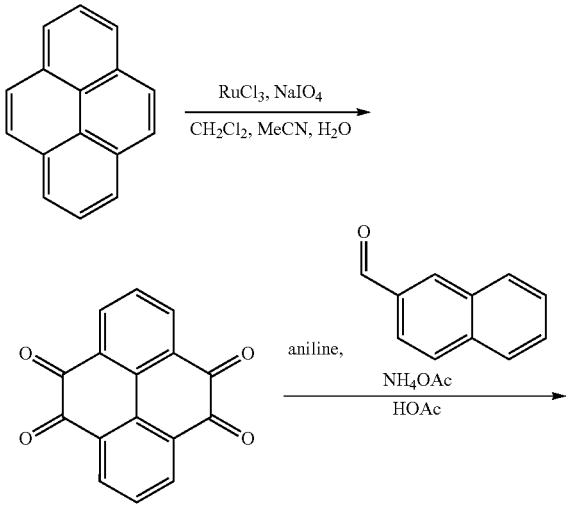

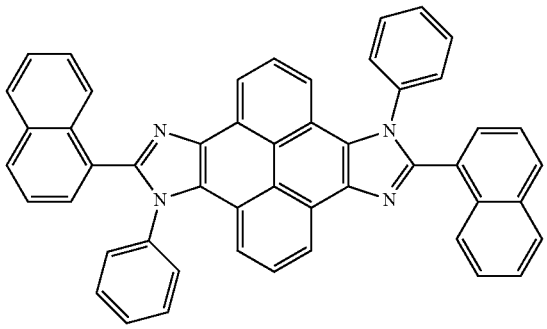

6-1. Synthesis of Compound N

Pyrene (2 g, 10 mmol), sodium periodate ($NaIO_4$, 17.5 g, 81.8 mmol), ruthenium trichloride ($RuCl_3.xH_2O$, 0.25 g, 1.2 mmol), acetonitrile (MeCN, 40 mL), methylene chloride ($CH_2Cl_2$, 40 mL) and distilled water ($H_2O$, 50.0 mL) were stirred at 30 to 40° C. overnight. The reaction product was cooled to room temperature and added to 200 mL of distilled water, and then the formed precipitate was filtered off under reduced pressure. The filtrate was extracted with methylene chloride ($CH_2Cl_2$) and thereto was added anhydrous magnesium sulfate ($MgSO_4$) to remove moisture, and then the solvent was removed under reduced pressure. The residue was passed through a silica gel column with methylene chloride as an eluent to obtain the product, and then the solvent was removed under reduced pressure and the product was dried in vacuo to prepare the desired compound N as a solid (0.940 g, 36%). MS: $[M+H]^+$=263.

6-2. Synthesis of Compound O (Formula (6-2))

The compound N (0.53 g, 2 mmol), aniline (2 g, 21.5 mmol), 1-naphthalaldehyde (0.672 g, 4.3 mmol), ammonium acetate (0.497 g, 6.45 mmol), 10 mL of toluene and 10 mL of acetic acid were heated for 12 hours. The reaction mixture was cooled to room temperature. The resulting solid was filtered and washed with ethanol and water to obtain the compound O represented by the formula (6-2) (0.75 g, yield 55%). MS $[M+H]^+$=686.

SYNTHESIS EXAMPLE 7

Synthesis of Formula (7-1)

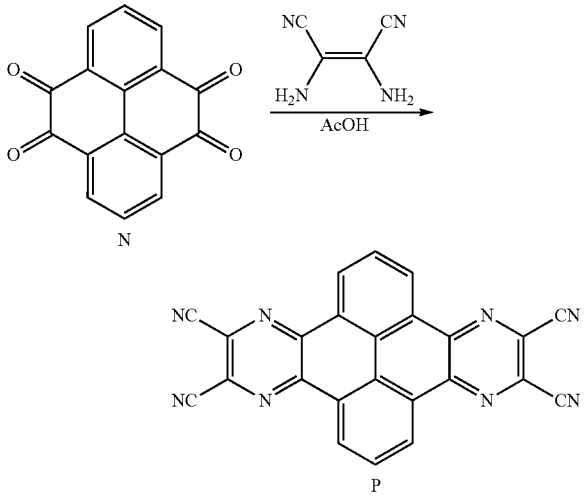

The compound N (2.62 g, 10 mmol), diaminomalenitrile (2.16 g, 20 mmol) and 10 mL of acetic acid were heated overnight. The reaction mixture was cooled to room temperature. The resulting solid was filtered and washed with ethanol and water to obtain the compound P (Formula (7-1)) represented by the formula (7-1) (2.84 g, yield 70%). MS $[M+H]^+$=408.

SYNTHESIS EXAMPLE 8

Synthesis of Formula (7-20)

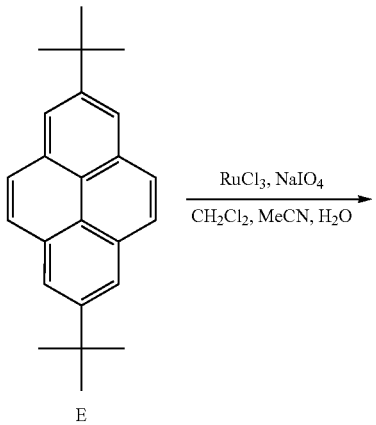

-continued

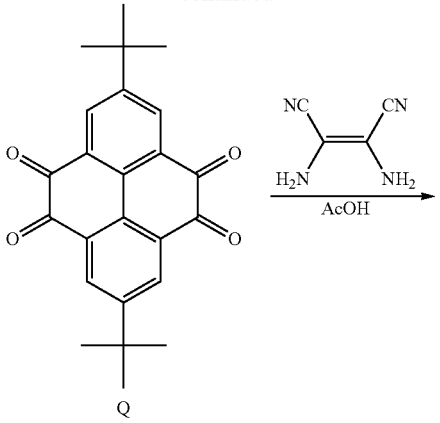

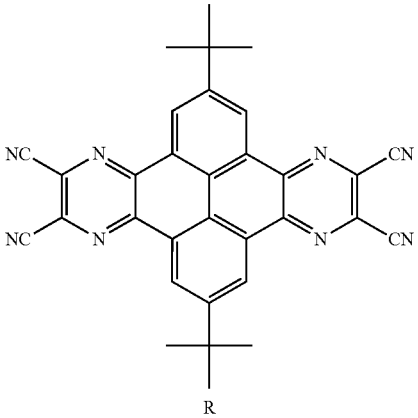

8-1. Synthesis of Compound Q

The compound E (3.15 g, 10 mmol), sodium periodate ($NaIO_4$, 17.5 g, 81.8 mmol), ruthenium trichloride ($RuCl_3.xH_2O$, 0.25 g, 1.2 mmol), acetonitrile (MeCN, 40 mL), methylene chloride ($CH_2Cl_2$, 40 mL) and distilled water ($H_2O$, 50.0 mL) were stirred at 30 to 40° C. overnight. The reaction product was cooled to room temperature and added to 200 mL of distilled water, and then the formed precipitate was filtered off under reduced pressure. The filtrate was extracted with methylene chloride ($CH_2Cl_2$) and thereto was added anhydrous magnesium sulfate ($MgSO_4$) to remove moisture, and then the solvent was removed under reduced pressure. The residue was passed through a silica gel column with methylene chloride as an eluent to obtain the product, and then the solvent was removed under reduced pressure and the product was dried in vacuo to prepare the desired compound Q as a solid (1.5 g, 40%). MS: $[M+H]^+$=376.

8-2. Synthesis of Compound R (Formula (7-20))

The compound Q (3.76 g, 10 mmol), diaminomalenitrile (2.16 g, 20 mmol) and 10 mL of acetic acid were heated overnight. The reaction mixture was cooled to room temperature. The resulting solid was filtered and washed with ethanol and water to obtain the compound R represented by the formula (7-20) (3.63 g, yield 70%). MS $[M+H]^+$=519.

SYNTHESIS EXAMPLE 9

Synthesis of Formula (8-4)

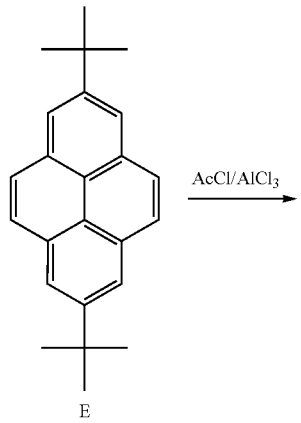

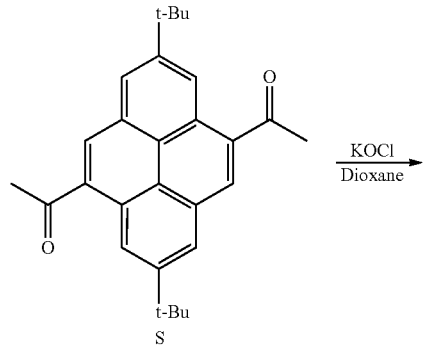

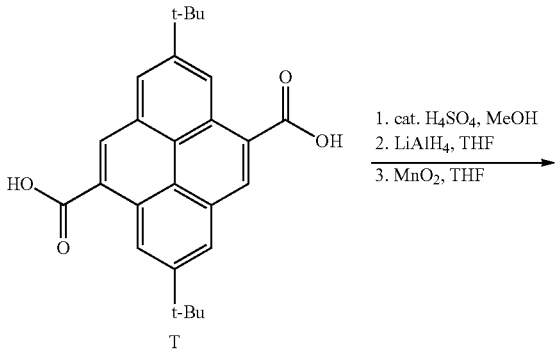

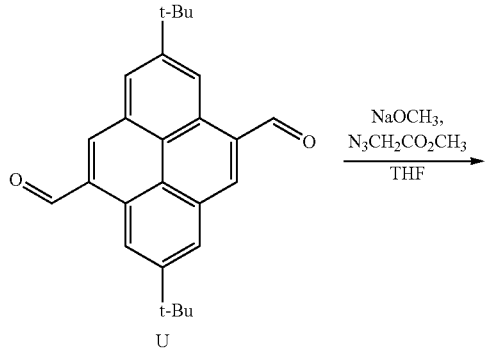

-continued

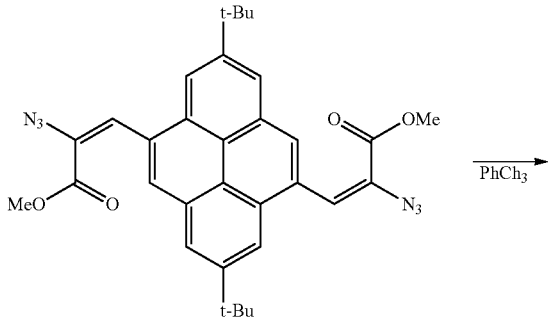

V

-continued

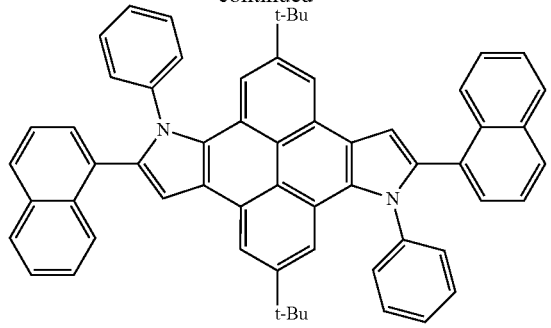

Z

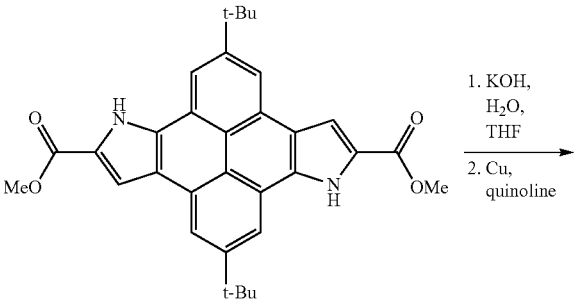

W

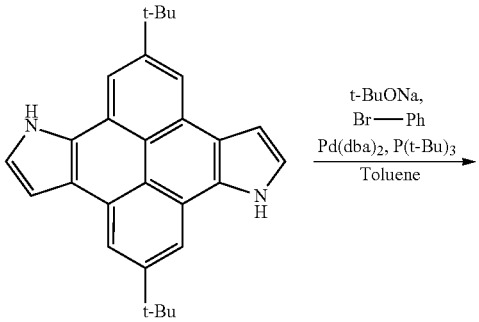

X

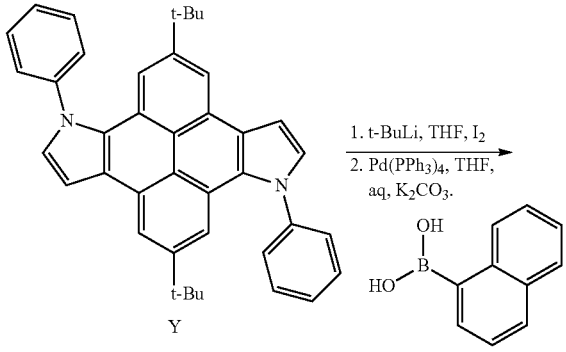

Y 9-1. Synthesis of Compound S

The compound E (10.0 g, 32.0 mmol) was dissolved in 300 mL of methylene chloride ($CH_2Cl_2$). To the reaction solution was added aluminum chloride ($AlCl_3$, 4.0 g, 30.0 mmol) and then acetyl chloride ($CH_3COCl$, 25 g, 320 mmol) at −5° C. The reaction solution was stirred at room temperature for 12 hours and then poured into iced water to terminate the reaction. The reaction solution was extracted with methylene chloride ($CH_2Cl_2$), dried over anhydrous magnesium sulfate, concentrated under reduced pressure and then passed through a column with hexane/benzene (1:1) to obtain the compound S (9.5 g, 75%). MS: $[M+H]^+$=399.

9-2. Synthesis of Compound T 35 mL of distilled water was maintained at 70° C. and thereto was added calcium hypochlorite ($Ca(OCl)_2$, 18 g, 12.5 mmol). Thereto was added a mixed solution of potassium hydroxide (KOH, 3.7 g, 66 mmol) and potassium carbonate ($K_2CO_3$, 13 g, 94 mmol) dissolved in 60 ml, of distilled water. To the potassium hypochlorite (KOCl) solution thus obtained was added the compound S (7.0 g, 18 mmol) dissolved in 90 mL of dioxane. This mixed solution was stirred under reflux for 1 hour and cooled to room temperature. To the solution were added distilled water (50 mL) and methylene chloride (50 mL) to separate into an organic layer and an aqueous layer. Then, the organic layer was removed and to the remaining aqueous layer was added a 10% hydrochloric acid solution to acidify to pH 1. The resulting solid was filtered, washed with water and dried to obtain the compound T (5.1 g, 72%). MS: $[M+H]^+$=403.

9-3. Synthesis of Compound U

The compound T (5.0 g, 12.4 mmol) was dissolved in 500 mL of methanol and thereto was added 5 mL of sulfuric acid. The reaction solution was stirred under reflux for 12 hours and cooled to room temperature. To the solution were added chloroform and distilled water to separate into an organic layer and an aqueous layer. Then, the aqueous layer was removed and anhydrous sodium sulfate ($Na_2SO_4$) was added to the organic layer to remove moisture and the solvent was removed under reduced pressure. The obtained compound was passed through a silica gel column with hexane/benzene (1:1) as an eluent, and then the solvent was removed under reduced pressure and the obtained compound was dried in vacuo to prepare the desired compound (4.8 g, 90%). MS: $[M+H]^+$=431.

The obtained compound (5.0 g, 11.6 mmol) was dissolved in 100 mL of tetrahydrofuran (THF) and thereto was added $LiAlH_4$ (1.37 g, 36 mmol). The reaction solution was stirred at room temperature for 3 hours and cooled to 0° C., and then thereto was added a small amount of ethyl acetate ($CH_3CO_2CH_2CH_3$) to remove the remaining $LiAlH_4$. The reaction solution was poured into iced water to terminate the reaction. Then, the reaction solution was extracted with methylene chloride ($CH_2Cl_2$), dried over anhydrous magnesium sulfate, concentrated under reduced pressure and then recrystallized from chloroform to obtain an alcohol type compound (3.6 g, 83%). MS: [M+H]+=375.

The obtained alcohol type compound (1.87 g, 5 mmol) was dissolved in 300 mL of methylene chloride and thereto was added $MnO_2$ (1.7 g, 20 mmol). The reaction solution was stirred at room temperature for 3 hours and filtered through Celite, and then the solvent was removed under reduced pressure. The obtained compound was passed through a silica gel column with ethyl acetate/hexane (1:3) as an eluent, and then the solvent was removed under reduced pressure and the obtained compound was dried in vacuo to prepare the desired compound U (1.5 g, 82%). MS: $[M+H]^+$=371.

9-4. Synthesis of Compound V

Sodium methoxide (NaOMe, 2.16 g, 40 mmol) was added to 30 mL of methanol and the reaction solution was maintained at −15° C. To the reaction solution was added a solution of the compound U (1.85 g, 5 mmol) and methyl azidoacetate ($N_3CH_2CO_2CH_3$, 4.6 g, 40 mmol) dissolved in 40 mL of THF. The reaction solution was stirred for 3 hours while maintaining the temperature at −15° C. and then stirred at 0° C. for 3 hours. This mixed solution was poured into iced water and stirred for 10 minutes, and then the resulting solid was filtered, washed with water and dried to obtain the compound V (2.45 g, 87%). MS: $[M+H]^+$=565.

9-5. Synthesis of Compound W

The compound V (4.5 g, 8 mmol) was dissolved in 300 mL of toluene and the reaction solution was stirred under reflux for 3 hours. The reaction solution was stirred under reflux for further 1 hour from the time that nitrogen is no longer released and cooled to room temperature. The resulting solid was filtered and dried to obtain the compound W (1.62 g, 40%). MS: $[M+H]^+$=509.

9-6. Synthesis of Compound X

The compound W (1.52 g, 3 mmol) was dispersed in 100 mL of tetrahydrofuran (THF) and 30 mL of distilled water, thereto was added KOH (900 mg, 16 mmol) and then the reaction solution was stirred under reflux for 6 hours. The reaction solution was cooled to room temperature. Then, THF was removed under reduced pressure and the remaining solution was acidified with 6 N HCl, the resulting solid was filtered, washed with distilled water and dried to obtain an acid type compound (1.4 g, 97%). MS: $[M+H]^+$=481.

The obtained acid type compound (1.4 g, 2.9 mmol) and Cu powders (300 mg) were dispersed in 30 mL of quinoline and heated at 220° C. for 2 hours. The reaction solution was cooled to room temperature and then Cu powders were filtered off. The remaining filtrate was poured into iced water and adjusted to pH 4 with 2 N HCl. The filtrate was extracted with methylene chloride, dried over anhydrous sodium sulfate, concentrated under reduced pressure and passed through a column with ethyl acetate/hexane (1:2) to obtain the compound X (1.05 g, 92%). MS: $[M+H]^+$=393.

9-7. Synthesis of Compound Y

The compound X (393 mg, 1.0 mmol), bromobenzene (0.31 g, 2 mmol), t-BuONa (0.77 g, 8 mmol), $Pd(dba)_2$ (23 mg, 0.02 mol%) and $P(t\text{-}Bu)_3$ (10 mg, 0.02 mol%) were dissolved in 40 mL of toluene and then the reaction solution was stirred under reflux for 3 hours. The reaction solution was cooled to room temperature and thereto were added distilled water and methylene chloride to separate into an organic layer and an aqueous layer. Then, the aqueous layer was removed, and only the organic layer was taken, dried over anhydrous sodium sulfate and filtered, and then the solvent was removed under reduced pressure. The obtained compound was passed through a silica gel column with tetrahydrofuran/hexane (1:2) as an eluent, and then the solvent was removed under reduced pressure and the obtained compound was dried in vacuo to prepare the desired compound Y (327 mg, 60%). MS: $[M+H]^+$=545.

9-8. Synthesis of Compound Z (Formula (8-4))

The compound Y (2.7 g, 5.0 mmol) was dissolved in 100 mL of THF and the reaction solution was maintained at −78° C. under an argon atmosphere. To this solution was slowly added 1.6 M t-BuLi (7 mL, 11.0 mmol) and the mixture was stirred at −78° C. for 3 hours. Iodine ($I_2$, 3.1 g, 12.0 mmol) was slowly added thereto while maintaining the temperature and the resulting mixture was stirred at −78° C. for 2 hours. The resulting mixture was heated to room temperature and iced water was poured thereinto to filter the resulting solid. The solid was passed through a silica gel column with tetrahydrofuran/hexane (1:1) as an eluent, and then the solvent was removed under reduced pressure and the solid was dried in vacuo to prepare the desired compound (2.78 g, 70%). MS: $[M+H]^+$=797.

The compound (400 mg, 0.5 mmol) obtained above, 1-naphthylboronic acid (172 mg, 1.0 mmol) and sodium carbonate (234 mg, 22.1 mmol) was suspended in a mixture of THF (20 mL), ethanol (3 mL) and water (10 mL). To the suspension was added tetrakis(triphenylphosphine)palladium (25 mg, 0.022 mmol). The mixture was stirred under reflux for 24 hours and then the refluxed mixture was cooled to room temperature. The organic layer was separated and washed with water, and the aqueous layer was extracted with chloroform. The organic extracts were dried over magnesium sulfate, concentrated in vacuo and subjected to column purification to obtain the compound Z (300 mg, 75%). MS $[M+H]^+$=798.

EXPERIMENTAL EXAMPLE 1

A glass substrate (Corning 7059 glass) on which a thin film of ITO (indium tin oxide) was coated to a thickness of 1000 Å was immersed in distilled water containing a detergent to wash the substrate with ultrasonic waves for 30 minutes (At this time, the detergent was a product commercially available from Fisher Co. and the distilled water has been filtered previously by using a filter commercially available from Millipore Co.). Next, washing with ultrasonic waves was repeated twice for 10 minutes by using distilled water. After the completion of washing with distilled water, washing with ultrasonic waves was carried out by using solvents such as isopropyl alcohol, acetone and methanol. The resultant product was dried.

On the ITO electrode thus prepared, hexanitrile hexaazatriphenylene, 4,4'-bis[N-(1-naphthyl)-N-phenylamino]biphenyl (NPB), the compound of the formula (3-3) prepared in Synthesis Example and an electron-transporting material of the following formula were sequentially coated to thicknesses of 500 Å, 400 Å, 300 Å and 200 Å by thermal vacuum deposition, thereby forming a hole-injecting layer, a hole-transporting layer, a light-emitting layer and an electron-transporting layer in this order.

[Electron-Transporting Material]

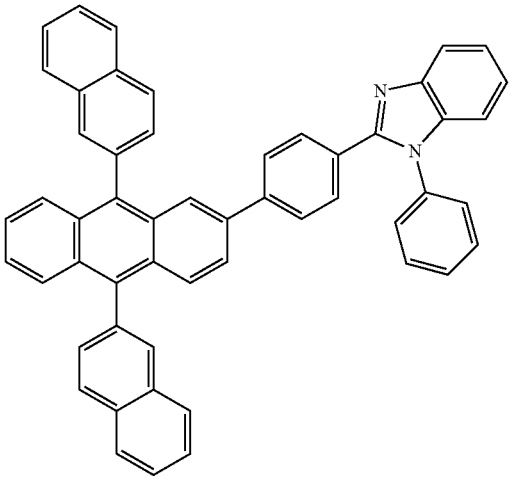

On the electron-transporting layer, lithium fluoride (LiF) and aluminum were sequentially vacuum-deposited to a thickness of 12 Å and 2000 Å, respectively, to form a cathode. Thus, an organic light-emitting device was produced.

In the above process, deposition rate of each organic material was maintained at 0.4 to 0.7 Å/sec and deposition rates of lithium fluoride and aluminum of the cathode were maintained at 0.3 Å/sec and 2 Å/sec, respectively. The vacuum degree during deposition was maintained at $2\times10^{-7}$ to $5\times10^{-8}$ torr.

When a forward electric field of 4.5 V was applied to the organic light-emitting device prepared above, blue light emission was observed with x=0.15 and y=0.20 based on the 1931 CIE color coordinate at a current density of 50 mA/cm$^2$. When a forward electric field of 5.4 V was applied, blue light emission of 1.3 cd/A was observed at a current density of 100 mA/cm$^2$.

EXPERIMENTAL EXAMPLE 2

An organic light-emitting device was produced in the same manner as in Experimental Example 1, except that on the ITO electrode, hexanitrile hexaazatriphenylene, 4,4'-bis[N-(1-naphthyl)-N-phenylamino]biphenyl (NPB), $Alq_3$ and the compound of the formula (3-3) prepared in Synthesis Example were sequentially coated to thicknesses of 500 Å, 400 Å, 300 Å and 200 Å by thermal vacuum deposition, thereby forming a hole-injecting layer, a hole-transporting layer, a light-emitting layer and an electron-transporting layer in this order, and then on the electron-transporting layer, lithium fluoride (LiF) and aluminum were sequentially vacuum-deposited to a thickness of 12 Å and 2000 Å, respectively, to form a cathode. When a forward electric field of 6.2 V was applied to the organic light-emitting device prepared above, green light emission was observed with x=0.34 and y=0.56 based on the 1931 CIE color coordinate at a current density of 50 mA/cm$^2$. When a forward electric field of 7.2 V was applied, green light emission of 3.0 cd/A was observed at a current density of 100 mA/cm$^2$.

EXPERIMENTAL EXAMPLE 3

An organic light-emitting device was produced in the same manner as in Experimental Example 1, except that on the ITO electrode, hexanitrile hexaazatriphenylene and a hole-injecting material of the following formula were coated to thicknesses of 80 Å and 800 Å, thereby forming a bilayered hole-injecting layer; the compound of the formula (3-3) prepared in Synthesis Example was coated thereon to a thickness of 300 Å to form a hole-transporting layer; $Alq_3$ and an electron-transporting material of the following formula were sequentially coated thereon to thicknesses of 300 Å and 200 Å by thermal vacuum deposition, thereby forming a light-emitting layer and an electron-transporting layer; and then on the electron-transporting layer, lithium fluoride (LiF) and aluminum were sequentially vacuum-deposited to a thickness of 12 Å and 2000 Å, respectively, to form a cathode.

[Hole-Injecting Material] [Electron-Transporting Material]

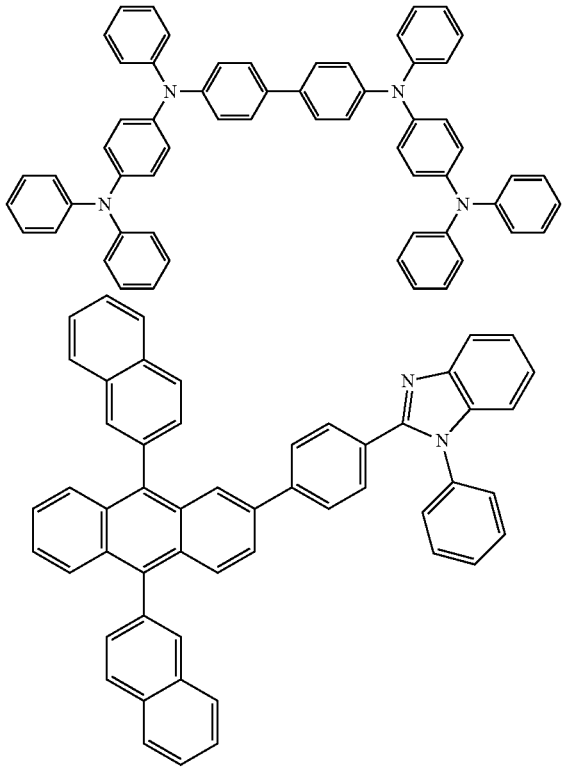

When a forward electric field of 6.7 V was applied to the organic light-emitting device prepared above, green light emission was observed with x=0.34 and y=0.51 based on the 1931 CIE color coordinate at a current density of 50 mA/cm$^2$. When a forward electric field of 7.7 V was applied, green light emission of 3.9 cd/A was observed at a current density of 100 mA/cm$^2$.

EXPERIMENTAL EXAMPLE 4

An organic light-emitting device was produced in the same manner as in Experimental Example 3, except that on the ITO electrode, hexanitrile hexaazatriphenylene, the hole-injecting material of the formula shown in Experimental Example 3 and the compound of the formula (3-3) were coated to thicknesses of 80 Å, 1000 Å and 100 Å, thereby forming a hole-transporting layer; and $Alq_3$ and the electron-transporting material of the formula shown in Experimental Example 3 were sequentially coated thereon to thicknesses of 300 Å and 200 Å by thermal vacuum deposition, thereby forming a light-emitting layer and an electron-transporting layer, with varying the thickness of each layer in Experimental Example 3.

When a forward electric field of 4.8 V was applied to the organic light-emitting device prepared above, green light emission was observed with x=0.34 and y=0.54 based on the 1931 CIE color coordinate at a current density of 50 mA/cm$^2$. When a forward electric field of 5.6V was applied, green light emission of 4.1 cd/A was observed at a current density of 100 mA/cm$^2$.

EXPERIMENTAL EXAMPLE 5

An organic light-emitting device was produced in the same manner as in Experimental Example 3, except that on the ITO electrode, the compound of the formula (4-1) and the hole-injecting material of the formula shown in Experimental Example 3 were coated to thicknesses of 80 Å and 800 Å, thereby forming a bilayered hole-injecting layer; 4,4'-bis[N-(1-naphthyl)-N-phenylamino]biphenyl (NPB), $Alq_3$ and the electron-transporting material of the formula shown in Experimental Example 3 were sequentially coated thereon to thicknesses of 300 Å, 300 Å and 200 Å by thermal vacuum deposition, thereby forming a hole-transporting layer, a light-emitting layer and an electron-transporting layer in this order, and then on the electron-transporting layer, lithium fluoride (LiF) and aluminum were sequentially vacuum-deposited to a thickness of 12 Å and 2000 Å, respectively, to form a cathode.

When a forward electric field of 5.0 V was applied to the organic light-emitting device prepared above, green light emission was observed with x=0.35 and y=0.56 based on the 1931 CIE color coordinate at a current density of 50 mA/cm$^2$. When a forward electric field of 5.7 V was applied, green light emission of 3.0 cd/A was observed at a current density of 100 mA/cm$^2$.

EXPERIMENTAL EXAMPLE 6

An organic light-emitting device was produced in the same manner as in Experimental Example 4, except that on the ITO electrode, hexanitrile hexaazatriphenylene and the hole-injecting material of the formula shown in Experimental Example 3 were coated to thicknesses of 80 Å and 1000 Å, thereby forming a bilayered hole-injecting layer; the compound of the formula (5-21) prepared in Synthesis Example was coated thereon to a thickness of 100 Å to form a hole-transporting layer; $Alq_3$ and the electron-transporting material of the formula shown in Experimental Example 3 were sequentially coated thereon to thicknesses of 300 Å and 200 Å by thermal vacuum deposition, thereby forming a light-emitting layer and an electron-transporting layer; and then on the electron-transporting layer, lithium fluoride (LiF) and aluminum were sequentially vacuum-deposited to a thickness of 12 Å and 2000 Å, respectively, to form a cathode.

When a forward electric field of 4.7 V was applied to the organic light-emitting device prepared above, green light emission was observed with x=0.34 and y=0.51 based on the 1931 CIE color coordinate at a current density of 50 mA/cm$^2$. When a forward electric field of 5.9 V was applied, green light emission of 4.3 cd/A was observed at a current density of 100 mA/cm$^2$.

EXPERIMENTAL EXAMPLE 7

An organic light-emitting device was produced in the same manner as in Experimental Example 3, except that on the ITO electrode, the compound of the formula (7-1) and the hole-injecting material of the formula shown in Experimental Example 3 were coated to thicknesses of 80 Å and 800 Å, thereby forming a bilayered hole-injecting layer, 4,4'-bis[N-(1-naphthyl)-N-phenylamino]biphenyl (NPB), $Alq_3$ and the electron-transporting material of the formula shown in Experimental Example 3 were sequentially coated thereon to thicknesses of 300 Å, 300 Å and 200 Å by thermal vacuum deposition, thereby forming a hole-transporting layer, a light-emitting layer and an electron-transporting layer in this order; and then on the electron-transporting layer, lithium fluoride (LiF) and aluminum were sequentially vacuum-deposited to a thickness of 12 Å and 2000 Å, respectively, to form a cathode.

When a forward electric field of 4.1 V was applied to the organic light-emitting device prepared above, green light emission was observed with x=0.34 and y=0.56 based on the 1931 CIE color coordinate at a current density of 50 mA/cm$^2$. When a forward electric field of 5.0 V was applied, green light emission of 2.8 cd/A was observed at a current density of 100 mA/cm$^2$.

EXPERIMENTAL EXAMPLE 8

An organic light-emitting device was produced in the same manner as in Experimental Example 3, except that on the ITO electrode, the compound of the formula (7-20) and the hole-injecting material of the formula shown in Experimental Example 3 were coated to thicknesses of 80 Å and 800 Å, thereby forming a bilayered hole-injecting layer; 4,4'-bis[N-(1-naphthyl)-N-phenylamino]biphenyl (NPB), $Alq_3$ and the electron-transporting material of the formula shown in Experimental Example 3 were sequentially coated thereon to thicknesses of 300 Å, 300 Å and 200 Å by thermal vacuum deposition, thereby forming a hole-transporting layer, a light-emitting layer and an electron-transporting layer in this order; and then on the electron-transporting layer, lithium fluoride (LiF) and aluminum were sequentially vacuum-deposited to a thickness of 12 Å and 2000 Å, respectively, to form a cathode.

When a forward electric field of 4.7 V was applied to the organic light-emitting device prepared above, green light emission was observed with x=0.34 and y=0.56 based on the 1931 CIE color coordinate at a current density of 50 mA/cm$^2$. When a forward electric field of 5.6 V was applied, green light emission of 3.1 cd/A was observed at a current density of 100 mA/cm$^2$.

EXPERIMENTAL EXAMPLE 9

An organic light-emitting device was produced in the same manner as in Experimental Example 1, except that on the ITO electrode, hexanitrile hexaazatriphenylene, 4,4'-bis[N-(1-naphthyl)-N-phenylamino]biphenyl (NPB), the compound of the formula (8-4) prepared in Synthesis Example and the electron-transporting material of the formula shown in Experimental Example 3 were sequentially coated to thicknesses of 500 Å, 400 Å, 300 Å and 200 Å by thermal vacuum deposition, thereby forming a hole-injecting layer, a hole-transporting layer, a light-emitting layer and an electron-transporting layer in this order, and then on the electron-transporting layer, lithium fluoride (LiF) and aluminum were sequentially vacuum-deposited to a thickness of 12 Å and 2000 Å, respectively, to form a cathode. When a forward electric field of 4.5 V was applied to the organic light-emitting device prepared above, blue light emission was observed with x=0.16 and y=0.22 based on the 1931 CIE color coordinate at a current density of 50 mA/cm$^2$. When a forward electric field of 5.7 V was applied, blue light emission of 2.1 cd/A was observed at a current density of 100 mA/cm$^2$.

The invention claimed is:

1. An organic light-emitting device comprising a first electrode, a second electrode and at least one organic material layer arranged between the first electrode and the second electrode, in which at least one organic material layer comprises a compound represented by the following formula (1):

(1)

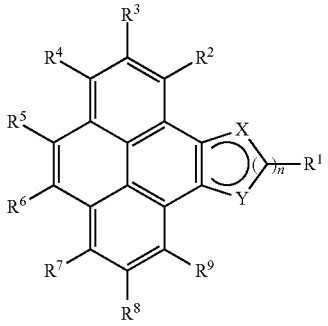

wherein n is an integer of 1 or 2;

X is CH or N;

Y is NR$^0$ when n=1 and N when n=2 wherein R$^0$ is selected from the group consisting of a substituted or unsubstituted alkyl group and a substituted or unsubstituted aryl group;

R$^1$ to R$^9$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—NO$_2$), a halogen group, an amide group (—NHCOR, —CONHR, —CONRR'), an ester group (—COOR), a sulfonyl group (—SO$_2$R), a sulfoxide group (—SOR), a sulfonamide group (—SO$_2$NRR'), a sulfonate group (—SO$_3$R), a trifluoromethyl group (—CF$_3$) and -L-M, and the R$^1$ to R$^9$ may form an aromatic, aliphatic or heterocyclic fused ring, together with the adjacent group;

L is a C$_1$-C$_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a C$_6$-C$_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—PO$_3$H), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted C$_1$-C$_{60}$ alkyl group, a substituted or unsubstituted C$_6$-C$_{60}$ aryl group; or a substituted or unsubstituted 5- to 7-membered heterocyclic group.

2. The organic light-emitting device according to claim 1, wherein the compound of the formula (1) is the compound of the following formula (2):

(2)

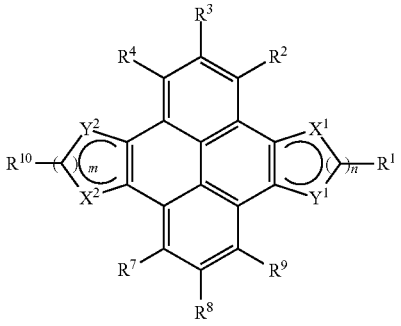

wherein m and n are each an integer of 1 or 2;

X$^1$ and X$^2$ are each independently CH or N;

Y$^1$ and Y$^2$ are each independently NR$^0$ when n=1 and N when n=2 wherein R$^0$ is selected from the group consisting of a substituted or unsubstituted alkyl group and a substituted or unsubstituted aryl group;

R$^1$ to R$^4$ and R$^7$ to R$^{10}$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—NO$_2$), a halogen group, an amide group (—NHCOR, —CONHR, —CONRR'), an ester group (—COOR), a sulfonyl group (—SO$_2$R), a sulfoxide group (—SOR), a sulfonamide group (—SO$_2$NRR'), a sulfonate group (—SO$_3$R), a trifluoromethyl group (—CF$_3$) and -L-M, and the R$^1$ to R$^4$ and R$^7$ to R$^{10}$ may form an aromatic, aliphatic or heterocyclic fused ring, together with the adjacent group;

L is a C$_1$-C$_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a C$_6$-C$_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

3. The organic light-emitting device according to claim 1, wherein the compound of the formula (1) is selected from the compounds of the following formulas (3) to (8):

(3)

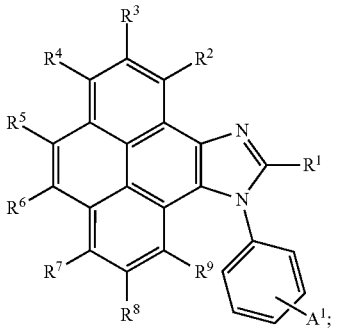

(4)

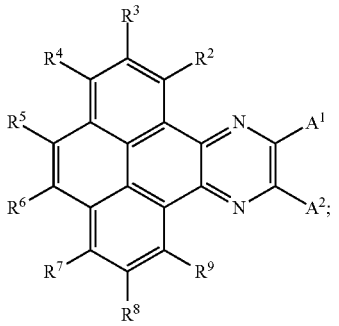

(5)

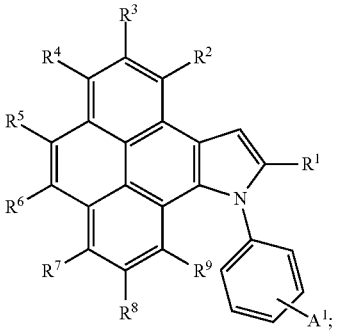

-continued (6)

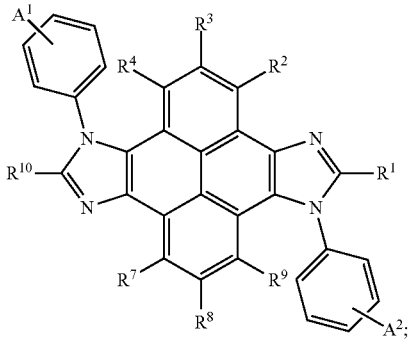

(7)

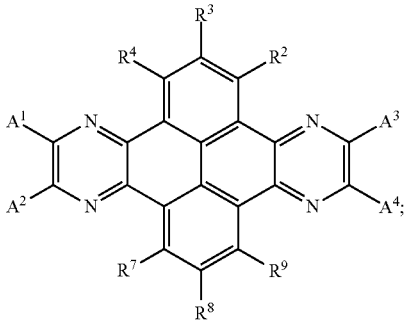

and (8)

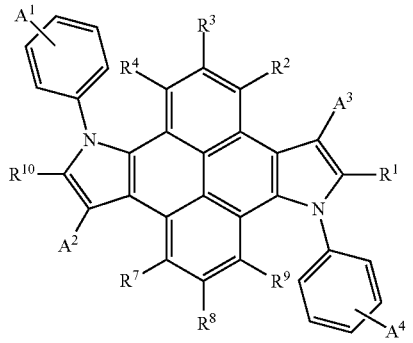

wherein $R^1$ to $R^{10}$ and $A^1$ to $A^4$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^{10}$ and $A^1$ to $A^4$ may form an aromatic, aliphatic or heterocyclic fused ring, together with the adjacent group;

*in formula (8), at least one of A2 or A3 is a hydrogen atom;*

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

4. The organic light-emitting device according to any one of claims 1 to 3, wherein the organic material layer comprises an electron-injecting layer and an electron-transporting layer, and the electron-injecting layer and the electron-transporting layer comprise the compound of the formula (1).

5. The organic light-emitting device according to any one of claims 1 to 3, wherein the organic material layer comprises a light-emitting layer, and the light-emitting layer comprises the compound of the formula (1).

6. The organic light-emitting device according to any one of claims 1 to 3, wherein the organic material layer comprises a hole-injecting layer or hole-transporting layer, and the hole-injecting layer or hole-transporting layer comprises the compound of the formula (1).

7. The organic light-emitting device according to any one of claims 1 to 3, wherein the organic material layer comprises a layer simultaneously performing electron injection/transportation and light emission, and the layer comprises the compound of the formula (1).

8. An organic solar cell comprising a first electrode, a second electrode and at least one organic material layer arranged between the first electrode and the second electrode, in which at least one organic material layer comprises a compound represented by the following formula (1):

(1)

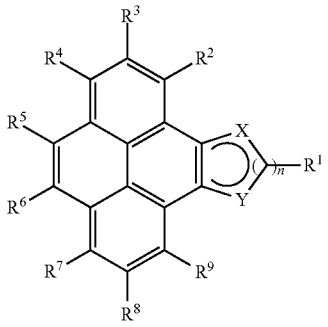

wherein n is an integer of 1 or 2;

X is CH or N;

Y is $NR^0$ when n=1 and N when n=2 wherein $R^0$ is selected from the group consisting of a substituted or unsubstituted alkyl group and a substituted or unsubstituted aryl group;

$R^1$ to $R^9$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^9$ may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

9. The organic solar cell according to claim 8, wherein the compound of the formula (1) is the compound of the following formula (2):

(2)

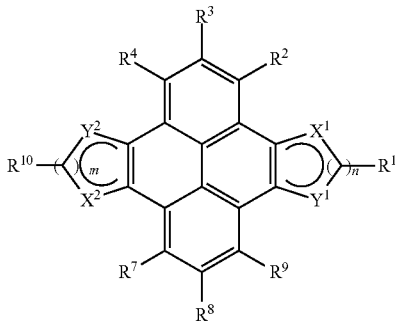

wherein m and n are each an integer of 1 or 2;

$X^1$ and $X^2$ are each independently CH or N;

$Y^1$ and $Y^2$ are each independently $NR^0$ when n=1 and N when n=2 wherein $R^0$ is selected from the group consisting of a substituted or unsubstituted alkyl group and a substituted or unsubstituted aryl group;

$R^1$ to $R^4$ and $R^7$ to $R^{10}$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^4$ and $R^7$ to $R^{10}$ may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

10. The organic solar cell according to claim 8, wherein the compound of the formula (1) is selected from the compounds of the following formulas (3) to (8):

(3)

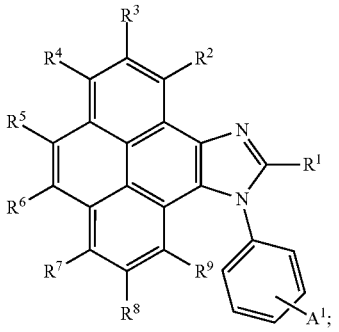

-continued (4)

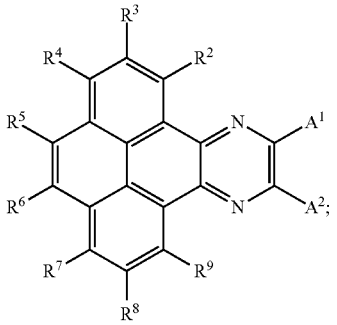

(5)

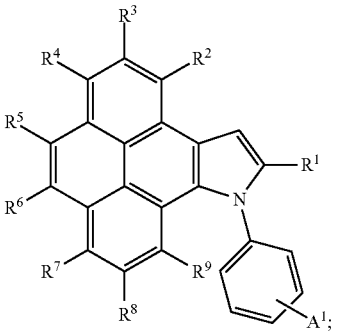

(6)

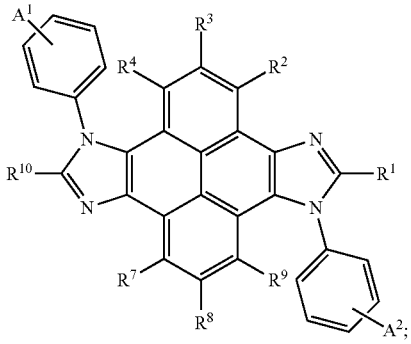

(7)

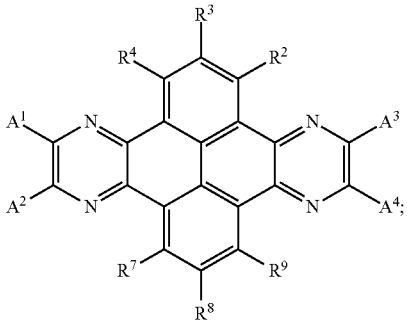

and (8)

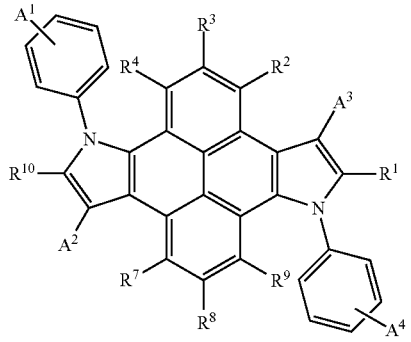

wherein $R^1$ to $R^{10}$ and $A^1$ to $A^4$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^{10}$ and $A^1$ to $A^4$ may form an aromatic, aliphatic or heterocyclic fused ring, together with the adjacent group;

*in formula (8), at least one of A2 or A3 is a hydrogen atom;*

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

11. An organic photoconductor comprising a first electrode, a second electrode and at least one organic material layer arranged between the first electrode and the second electrode, in which at least one organic material layer comprises a compound represented by the following formula (1):

(1)

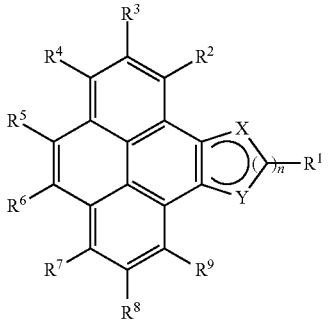

wherein n is an integer of 1 or 2;

X is CH or N;

Y is $NR^0$ when n=1 and N when n=2 wherein $R^0$ is selected from the group consisting of a substituted or unsubstituted alkyl group and a substituted or unsubstituted aryl group;

$R^1$ to $R^9$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$to $R^9$ may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

12. The organic photoconductor according to claim 11, wherein the compound of the formula (1) is the compound of the following formula (2):

(2)

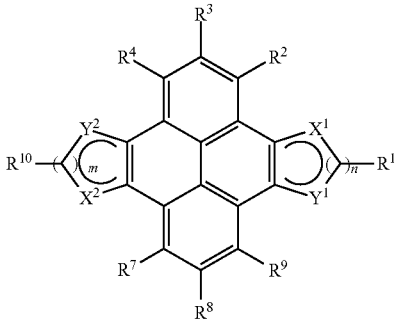

wherein m and n are each an integer of 1 or 2;

$X^1$ and $X^2$ are each independently CH or N;

$Y^1$ and $Y^2$ are each independently $NR^0$ when n=1 and N when n=2 wherein $R^0$ is selected from the group consisting of a substituted or unsubstituted alkyl group and a substituted or unsubstituted aryl group;

$R^1$ to $R^4$ and $R^7$ to $R^{10}$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^4$ and $R^7$ to $R^{10}$ may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

13. The organic photoconductor according to claim 11, wherein the compound of the formula (1) is selected from the compounds of the following formulas (3) to (8):

(3)

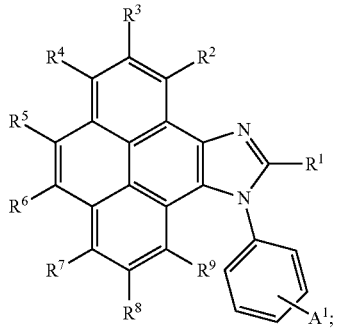

(4)

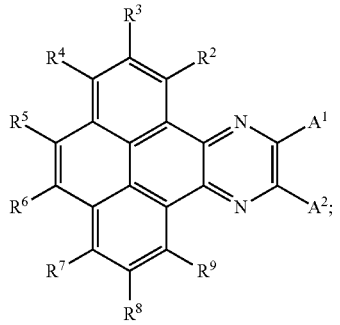

(5)

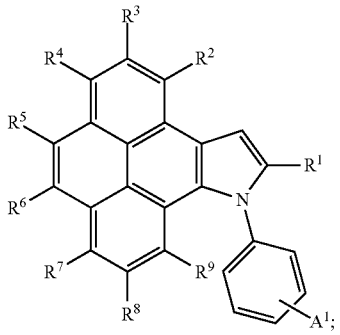

(6)

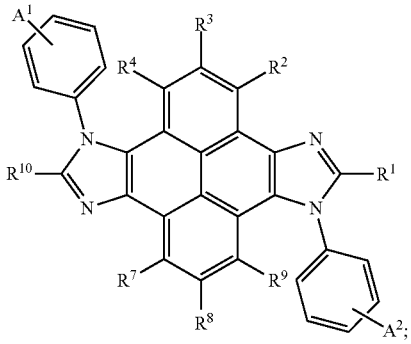

(7)

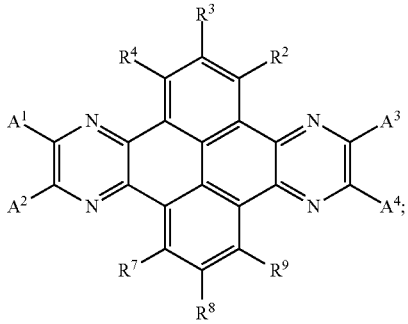

and

-continued (8)

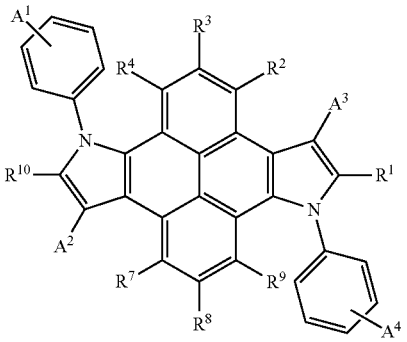

wherein $R^1$ to $R^{10}$ and $A^1$ to $A^4$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^{10}$ and $A^1$ to $A^4$ may form an aromatic, aliphatic or heterocyclic fused ring, together with the adjacent group;

*in formula (8), at least one of A2 or A3 is a hydrogen atom;*

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

14. A compound represented by the following formula (3):

(3)

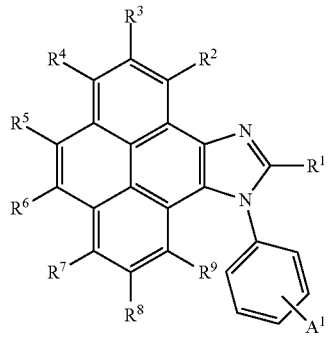

wherein $R^1$ to $R^9$ and $A^1$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^9$ and $A^1$ may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

15. A compound represented by the following formula (4):

(4)

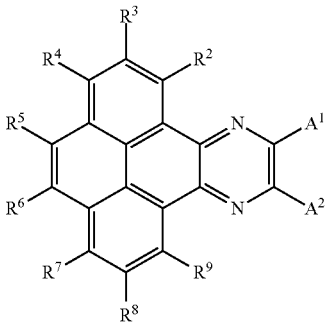

wherein $R^2$ to $R^9$, $A^1$ and $A^2$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), [a nitrile group (—CN),] a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^2$ to $R^9$, $A^1$ and $A^2$ may form an [aromatic,] aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

16. A compound represented by the following formula (5):

(5)

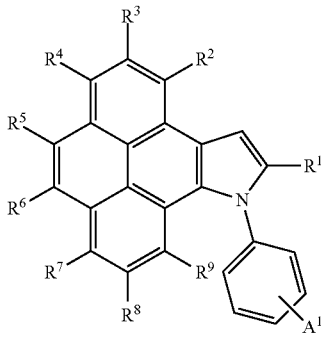

wherein $R^1$ to $R^9$ and $A^1$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^9$ and $A^1$ may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

17. A compound represented by the following formula (6):

(6)

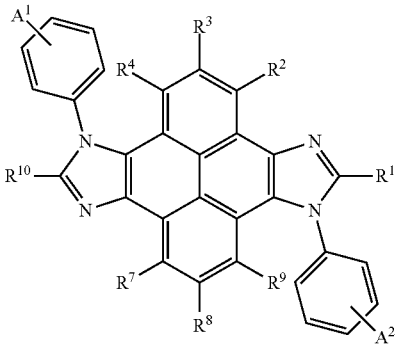

wherein $R^1$ to $R^4$, $R^7$ to $R^{10}$, $A^1$ and $A^2$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^4$, $R^7$ to $R^{10}$, $A^1$ and $A^2$ may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

18. A compound represented by the following formula (7):

(7)

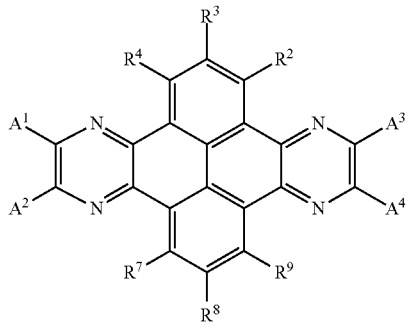

wherein $R^2$ to $R^4$[.] *and* $R^7$ to $R^9$[, and $A^1$ to $A^4$] are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR), a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^2$ to $R^4$[.] *and* $R^7$ to $R^9$[, and $A^1$ to $A^4$] may form an aromatic, aliphatic or heterocyclic fused ring, together with the adjacent group;

*$A^1$ to $A^4$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitro group (—$NO_2$), a halogen group, an amide group (—NHCOR, —CONHR, —CONRR'), an ester group (—COOR) a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $A^1$ to $A^4$ may form an aliphatic or heterocyclic fused ring, together with the adjacent group;*

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

19. A compound represented by the following formula (8):

(8)

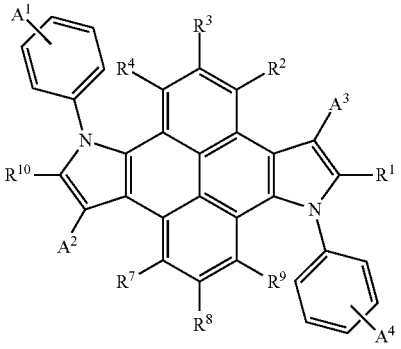

wherein $R^1$ to $R^4$, $R^7$ to $R^{10}$, and $A^1$ to $A^4$ are the same or different from each other and are each independently selected from the group consisting of a hydrogen atom, a substituted or unsubstituted alkyl group, a substituted or unsubstituted alkoxy group, a substituted or unsubstituted alkenyl group, a substituted or unsubstituted aryl group, a substituted or unsubstituted arylamine group, a substituted or unsubstituted heterocyclic group, a substituted or unsubstituted silane group, a substituted or unsubstituted boron group, a substituted or unsubstituted aliphatic cyclic group, an amine group (—NHR, —NRR'), a nitrile group (—CN), a nitro group (—$NO_2$), a halogen group, an amide group (—NHCOR, —CONHR, —CONRR'), an ester group (—COOR); a sulfonyl group (—$SO_2R$), a sulfoxide group (—SOR), a sulfonamide group (—$SO_2NRR'$), a sulfonate group (—$SO_3R$), a trifluoromethyl group (—$CF_3$) and -L-M, and the $R^1$ to $R^4$, $R^7$ to $R^{10}$, and $A^1$ to $A^4$ may form an aromatic, aliphatic or heterocyclic fused ring, together with the adjacent group;

L is a $C_1$-$C_{60}$ alkylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); a $C_6$-$C_{60}$ arylene group substituted or unsubstituted with at least one substituent selected from the group consisting of an amine group (—NHR, —NRR'), an amide group (—NHCOR, —CONHR, —CONRR'), an ether group (—COR) and an ester group (—COOR); or 5- to 7-membered heterocyclic group substituted or unsubstituted with at least one substituent selected from the group consisting of an amine group (—NHR, —NRR'), an amide group (—NHCOR, —CONHR, —CONRR'), an ether group (—COR) and an ester group (—COOR);

M is selected from the group consisting of an alcohol group (—OH), a thiol group (—SH), a phosphate group (—$PO_3H$), an amine group (—NHR, —NRR'), a substituted or unsubstituted polyolefin, a substituted or unsubstituted polyvinyl, a substituted or unsubstituted polyacrylate, a substituted or unsubstituted polythiophene, a substituted or unsubstituted polypyrrole, and a substituted or unsubstituted polyaniline; and R and R' are the same or different from each other and are each independently a hydrogen atom, a substituted or unsubstituted $C_1$-$C_{60}$ alkyl group, a substituted or unsubstituted $C_6$-$C_{60}$ aryl group; or a substituted or unsubstituted 5- to 7-membered heterocyclic group.

* * * * *